United States Patent
Barth

(10) Patent No.: US 9,680,105 B2
(45) Date of Patent: Jun. 13, 2017

(54) HYBRID CARBON-METAL INTERCONNECT STRUCTURES

(71) Applicant: INTEL CORPORATION, Santa Clara, CA (US)

(72) Inventor: Hans-Joachim Barth, Munich (DE)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 14/931,764

(22) Filed: Nov. 3, 2015

(65) Prior Publication Data

US 2016/0056384 A1  Feb. 25, 2016

Related U.S. Application Data

(62) Division of application No. 13/854,449, filed on Apr. 1, 2013, now Pat. No. 9,209,136.

(51) Int. Cl.
  *H01L 29/06* (2006.01)
  *H01L 51/00* (2006.01)
  (Continued)

(52) U.S. Cl.
  CPC ........ *H01L 51/0048* (2013.01); *H01L 21/486* (2013.01); *H01L 21/4853* (2013.01);
  (Continued)

(58) Field of Classification Search
  CPC ............. H01L 51/0048; H01L 21/4853; H01L 21/486; H01L 21/768; H01L 21/76805; H01L 21/76849; H01L 23/147; H01L 23/49811; H01L 23/49827; H01L 23/49838; H01L 23/49872; H01L 23/5226;
  (Continued)

(56) References Cited

U.S. PATENT DOCUMENTS 5,473,113 A 12/1995 Aldissi
7,858,989 B2* 12/2010 Chen ................. B82Y 10/00
                                                     257/76

(Continued)

FOREIGN PATENT DOCUMENTS

JP    2012164781 A    8/2012
TW    201304059 A     1/2013
WO    WO2011112589 A  9/2011

OTHER PUBLICATIONS

Mattevi, "A review of chemical vapour depostion of graphene on copper", J. Mater. Chem., 2011, 21, 3324-3334.

(Continued)

*Primary Examiner* — Yosef Gebreyesus
(74) *Attorney, Agent, or Firm* — Schwabe, Williamson & Wyatt, P.C.

(57) ABSTRACT

Embodiments of the present disclosure are directed towards techniques and configurations for hybrid carbon-metal interconnect structures in integrated circuit assemblies. In one embodiment, an apparatus includes a substrate, a metal interconnect layer disposed on the substrate and configured to serve as a growth initiation layer for a graphene layer and the graphene layer, wherein the graphene layer is formed directly on the metal interconnect layer, the metal interconnect layer and the graphene layer being configured to route electrical signals. Other embodiments may be described and/or claimed.

24 Claims, 15 Drawing Sheets

(51) Int. Cl.
*H01L 23/532* (2006.01)
*H01L 21/768* (2006.01)
*H01L 23/14* (2006.01)
*H01L 21/48* (2006.01)
*H01L 23/522* (2006.01)
*H01L 23/64* (2006.01)
*H01L 23/00* (2006.01)
*H01L 29/16* (2006.01)
*H01L 23/498* (2006.01)

(52) U.S. Cl.
CPC ...... *H01L 21/768* (2013.01); *H01L 21/76805* (2013.01); *H01L 21/76849* (2013.01); *H01L 21/76852* (2013.01); *H01L 21/76879* (2013.01); *H01L 23/147* (2013.01); *H01L 23/49811* (2013.01); *H01L 23/49827* (2013.01); *H01L 23/49838* (2013.01); *H01L 23/49872* (2013.01); *H01L 23/5226* (2013.01); *H01L 23/53276* (2013.01); *H01L 23/49816* (2013.01); *H01L 23/5227* (2013.01); *H01L 23/53238* (2013.01); *H01L 23/53252* (2013.01); *H01L 23/53266* (2013.01); *H01L 23/645* (2013.01); *H01L 24/13* (2013.01); *H01L 24/16* (2013.01); *H01L 24/48* (2013.01); *H01L 29/1606* (2013.01); *H01L 2221/1094* (2013.01); *H01L 2224/131* (2013.01); *H01L 2224/13147* (2013.01); *H01L 2224/16145* (2013.01); *H01L 2224/16225* (2013.01); *H01L 2224/451* (2013.01); *H01L 2224/48227* (2013.01); *H01L 2924/12032* (2013.01); *H01L 2924/14* (2013.01); *H01L 2924/1431* (2013.01); *H01L 2924/1433* (2013.01); *H01L 2924/1434* (2013.01); *H01L 2924/15311* (2013.01)

(58) Field of Classification Search
CPC ......... H01L 23/53276; H01L 23/49816; H01L 23/5227; H01L 23/53238; H01L 23/53252; H01L 23/53266; H01L 23/266; H01L 23/645; H01L 29/1606; H01L 2924/12032; H01L 2924/14; H01L 2924/1431; H01L 2924/1433; H01L 2924/1434; H01L 2924/15311; H01L 21/7684; H01L 21/76852
See application file for complete search history.

(56) References Cited

U.S. PATENT DOCUMENTS

| | | | |
|---|---|---|---|
| 8,785,261 | B2 | 7/2014 | King |
| 2003/0008490 | A1 | 1/2003 | Xing et al. |
| 2003/0214029 | A1 | 11/2003 | Tao et al. |
| 2010/0264032 | A1* | 10/2010 | Bazant ............... B01L 3/50273 204/518 |
| 2011/0006425 | A1 | 1/2011 | Wada et al. |
| 2011/0104442 | A1 | 5/2011 | Yoon et al. |
| 2011/0206934 | A1 | 8/2011 | Bol et al. |
| 2012/0018891 | A1* | 1/2012 | Lin ................... H01L 21/76802 257/773 |
| 2012/0080796 | A1 | 4/2012 | Wada et al. |
| 2012/0156424 | A1 | 6/2012 | Chen et al. |
| 2012/0168206 | A1 | 7/2012 | Sekine et al. |
| 2012/0181507 | A1 | 7/2012 | Dimitrakopoulos et al. |
| 2012/0256167 | A1 | 10/2012 | Heo et al. |
| 2012/0258587 | A1 | 10/2012 | Kub et al. |
| 2012/0286234 | A1 | 11/2012 | Yager |
| 2013/0001773 | A1 | 1/2013 | Cho et al. |
| 2013/0015581 | A1 | 1/2013 | Wann et al. |
| 2013/0020877 | A1 | 1/2013 | Miller |
| 2013/0056873 | A1 | 3/2013 | Wada et al. |
| 2013/0098540 | A1 | 4/2013 | Lee et al. |
| 2013/0141442 | A1 | 6/2013 | Brothers et al. |
| 2013/0200511 | A1 | 8/2013 | Banijamali |
| 2013/0217226 | A1 | 8/2013 | Kitamura et al. |
| 2013/0302978 | A1* | 11/2013 | Bonilla ............ H01L 21/76877 438/627 |
| 2014/0151640 | A1* | 6/2014 | Farmer ............... H01L 29/1606 257/29 |

OTHER PUBLICATIONS

Sarkar, "High-Frequency Behavior of Graphene-Bases Interconnects—Part I: Impedance Modeling", IEEE Transactions on Electron Devices, vol. 58, No. 3, Mar. 2011.

Sarkar, "High-Frequency Behavior of Graphene-Based Interconnects—Part II: Impedance Analysis and Implications for Inductor Design", IEEE Transactions on Electron Devices, vol. 58, No. 3, Mar. 2011.

Xu, "Modeling, Analysis, and Design of Graphene Nano-Ribbon Interconnects", IEEE Transactions on Electron Devices, vol. 56, No. 8, Aug. 2009.

Office Action dated Aug. 7, 2015 for Taiwan Patent Application No. 103111237; 16 pages (7 pages of English translation and 9 pages of Taiwanese Action).

Office Action and Search Report issued Mar. 21, 2016 for Taiwan Patent Application No. 103111237, 14 pages.

Office Action and Search Report issued Dec. 23, 2016 for Taiwan Patent Application No. 105122910, 25 pages.

* cited by examiner

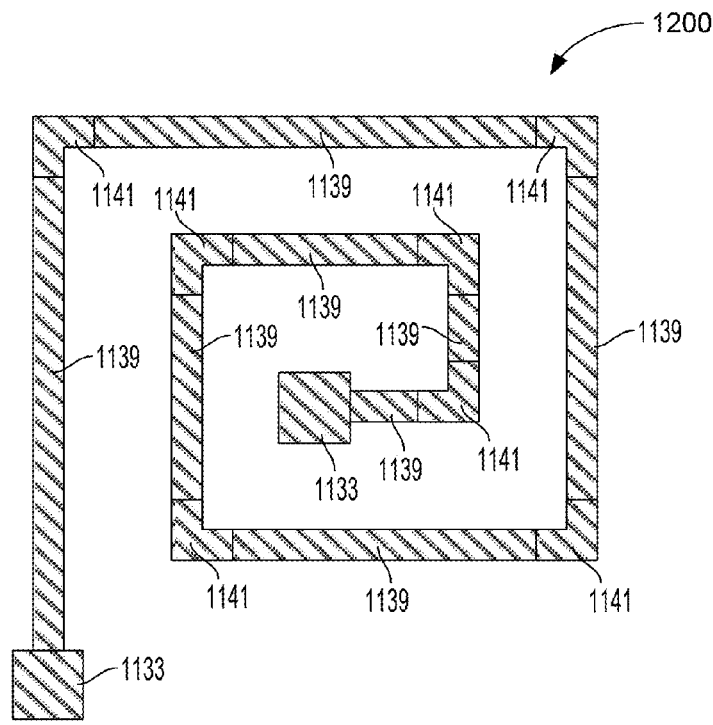
FIG. 12c
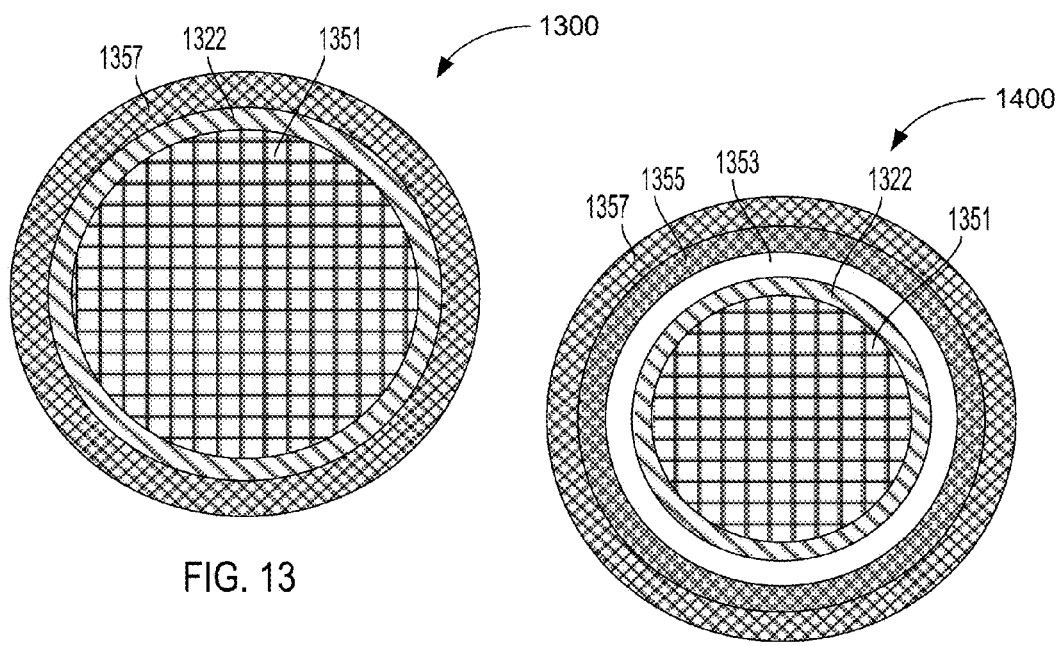
FIG. 13
FIG. 14

HYBRID CARBON-METAL INTERCONNECT STRUCTURES

CROSS-REFERENCE TO RELATED APPLICATION

This application is a divisional of U.S. patent application Ser. No. 13/854,449 filed Apr. 1, 2013 which is hereby incorporated by reference in its entirety.

FIELD

Embodiments of the present disclosure generally relate to the field of integrated circuits, and more particularly, to techniques and configurations for hybrid carbon-metal interconnect structures in integrated circuit assemblies.

BACKGROUND

Carbon materials such as, for example, carbon nanotubes (CNTs) or graphene nanoribbons (GNRs) are emerging as potential materials for use in integrated circuit (IC) assemblies. However, temperatures in excess of 800° C. may be needed to deposit such materials on a metallic substrate. Such temperatures may not be compatible with standard semiconductor manufacturing technologies such as, for example, complementary metal-oxide-semiconductor (CMOS) processes, which may be restricted during interconnect processing to temperatures less than about 450° C. Currently, such problem may be addressed by transferring the carbon material from the metallic substrate by an exfoliation type process to a desired substrate (e.g., a silicon wafer). However, such exfoliation processes or layer transfer processes may be costly, prone to defect creation and/or incompatible with high volume semiconductor manufacturing. Additionally, current interconnects for higher frequency radio frequency (RF) applications may exhibit a "skin effect," where electrical current is transported primarily in a surface region (skin) of the conductive material for increasing frequencies of the electrical current.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 12a-c schematically illustrate various stages of fabrication of hybrid carbon-metal interconnects in a spiral coil configuration using a suspended portion of the graphene layer, in accordance with some embodiments.

FIGS. 13-14 schematically illustrate a hybrid carbon-metal wire, in accordance with some embodiments.

DETAILED DESCRIPTION

Figure 1:
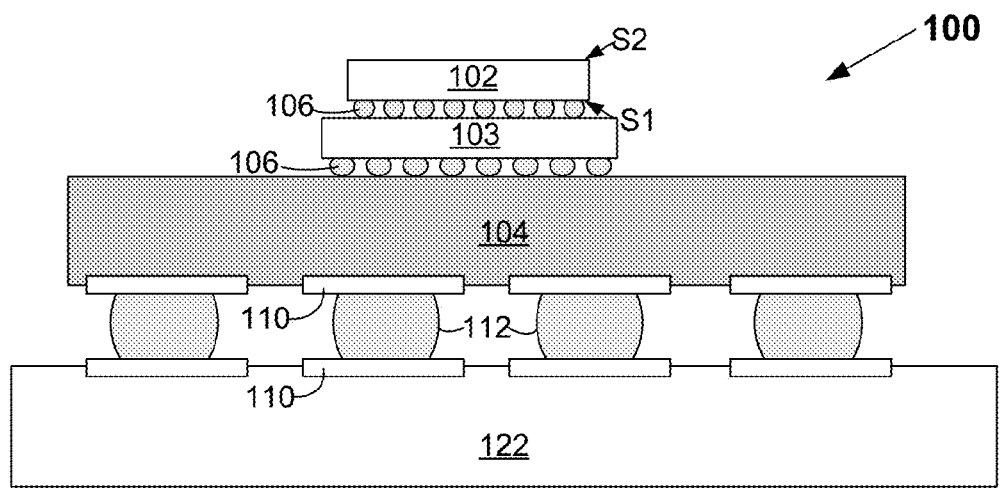
FIG. 1 schematically illustrates a cross-section side view of an example integrated circuit (IC) assembly configured to use a hybrid carbon-metal interconnect, in accordance with some embodiments.

Embodiments of the present disclosure describe techniques and configurations for hybrid carbon-metal interconnect structures in integrated circuit assemblies. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly 100 configured to use a hybrid carbon-metal interconnect, in accordance with some embodiments. In some embodiments, the IC assembly 100 may include one or more dies (hereinafter "die 102") electrically and/or physically coupled with an interposer 103, as can be seen. The IC assembly 100 may further include a package substrate 104 electrically coupled with the interposer 103 and the die 102, as can be seen. The package substrate 104 may further be electrically coupled with a circuit board 122, as can be seen. In some embodiments, the IC assembly 100 may refer to any component of the IC assembly including the hybrid carbon-metal interconnect.

Figure 2A:
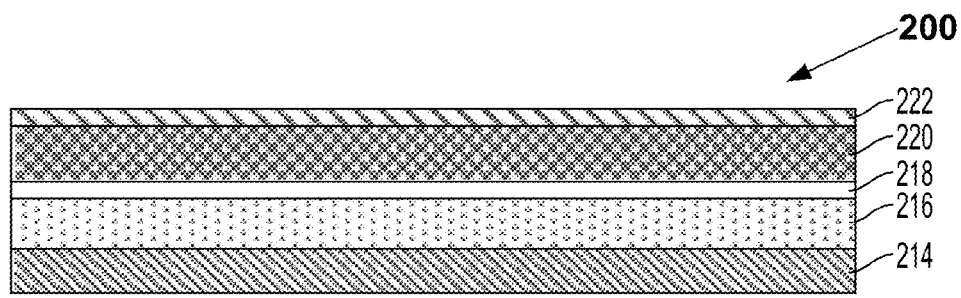
FIGS. 2a-f schematically illustrate various stages of fabrication of a hybrid carbon-metal interconnect according to a first technique, in accordance with some embodiments.
Figure 2B:
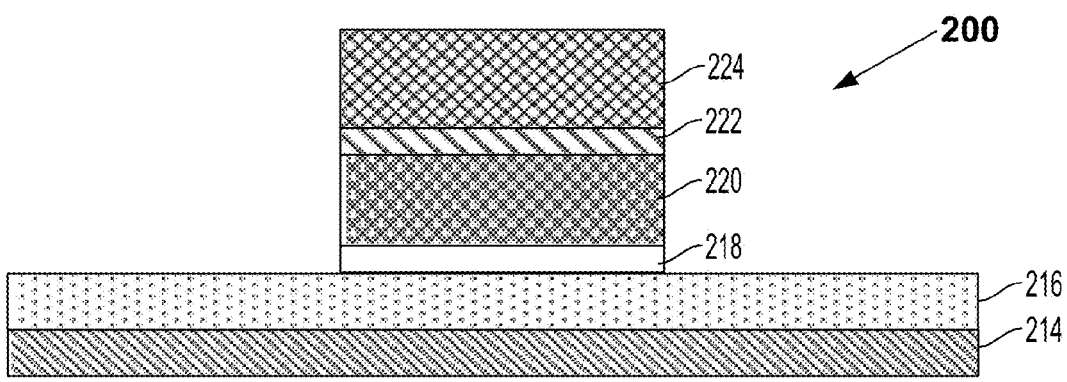
Figure 2C:
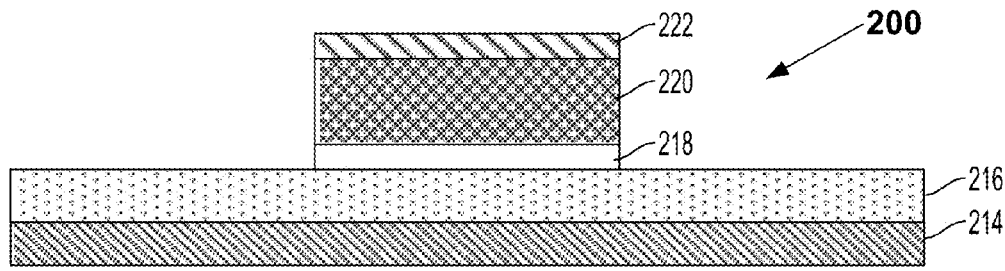
Figure 2D:
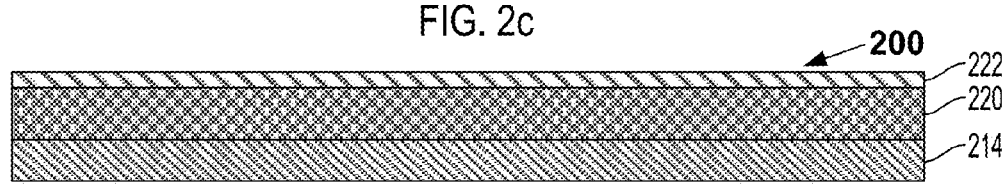
Figure 2E:
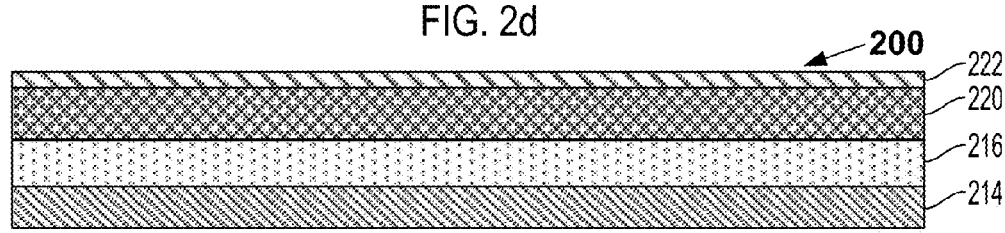
Figure 2F:
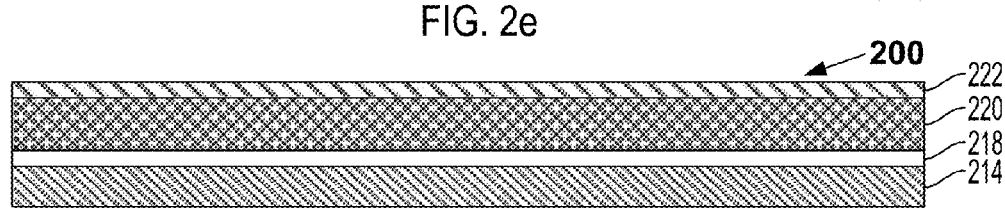
Figure 3A:
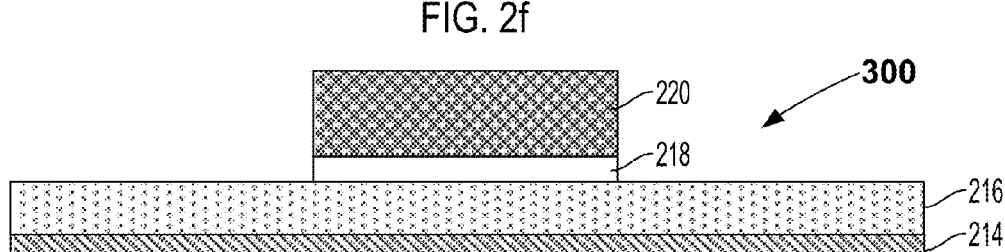
FIGS. 3a-b schematically illustrate various stages of fabrication of a hybrid carbon-metal interconnect according to a second technique, in accordance with some embodiments.
Figure 3B:
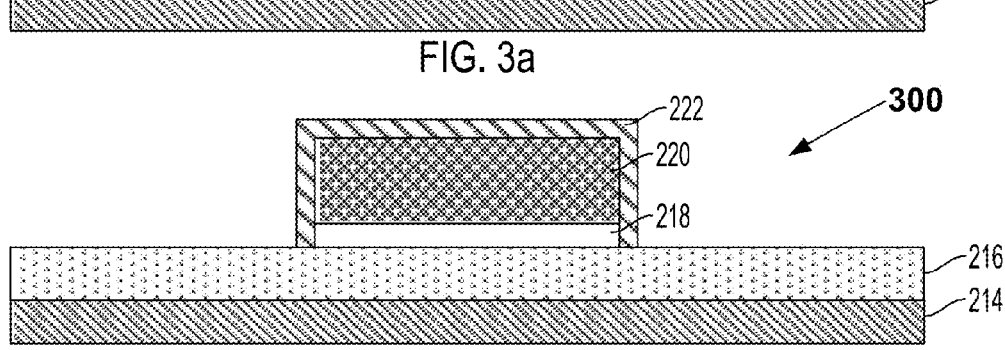

According to various embodiments, hybrid carbon-metal interconnects as described herein (e.g., hybrid carbon-metal interconnect 200 or 300 of respective FIG. 2c or 3b) may be configured in the IC assembly 100 to route electrical signals of the die 102 through various components of the IC assembly 100. The electrical signals may include, for example, input/output (I/O) signals, radio frequency (RF) signals or power/ground associated with operation of the die 102.

For example, in some embodiments, the hybrid carbon-metal interconnects may be used in components such as, for example, interposers (e.g., silicon or glass), integrated passive devices (IPDs) or other components of an IC assembly 100 that are compatible with thermal processing temperatures greater than 800° C. The hybrid carbon-metal interconnects may be embedded in or assembled on package substrates and/or circuit boards. In some embodiments, the hybrid carbon-metal interconnects may be formed on any component(s) of the IC assembly 100 that do not include active transistor devices formed on a substrate (e.g., substrate 214 of FIG. 2a) of the component(s). Typically, active transistor devices (e.g., in CMOS technologies) are not compatible with temperatures above 450° C. during interconnect processing or interconnect manufacturing. In some embodiments, the component(s) of the IC assembly 100 having the hybrid carbon-metal interconnects may further include one or more passive devices such as, for example, one or more of resistors, capacitors, inductors, transformers and the like formed on the substrate of the component(s).

It is contemplated that, in the future, new graphene growth or deposition processes and methods may be developed, which may allow graphene growth or graphene depositions on metallic materials at temperatures less than or equal to 450° C. In such a case, the hybrid carbon-metal interconnects described herein may be used in a die or chip having active transistor devices such as a die or chip fabricated using CMOS technologies and having CMOS transistor devices.

A component of the IC assembly 100 that does not include active transistor devices, but is configured to route the electrical signals may be generally referred to as an "interposer" including, for example, the interposer 103, the package substrate 104 and/or the circuit board 122, in some embodiments. A substrate of such component may be referred to as a "passive" substrate to indicate that no active transistor devices are formed on the substrate. In embodiments, hybrid carbon-metal interconnects may be part of any one or more of the interposer 103, the package substrate 104 and/or the circuit board 122.

The IC assembly 100 may include a wide variety of other suitable configurations in other embodiments including, for example, suitable combinations of flip-chip and/or wire-bonding configurations, multiple interposers, multi-chip package configurations including system-in-package (SiP) and/or package-on-package (PoP) configurations to route electrical signals between the die 102 and other components of the IC assembly 100 in some embodiments.

The die 102 can be attached to the package substrate 104 according to a wide variety of suitable configurations including, for example, being directly coupled with the interposer 103 in a flip-chip configuration and the interposer 103 being directly coupled with the package substrate 104 in a flip-chip or micro flip-chip configuration, as depicted. In the flip-chip configuration, an active side (e.g., side S1) of the die 102 is attached to a surface of the interposer 103 using interconnect structures 106 such as bumps, pillars, or other suitable structures that may also electrically couple the die 102 with the interposer 103. The active side of the die 102 may include a plurality of active integrated circuit (IC) devices such as, for example, transistor devices.

The interposer 103 may include electrical routing features to route electrical signals of the die 102 to or from the package substrate 104. The electrical routing features (not shown) may include, for example, bond pads or traces disposed on one or more surfaces of the interposer 103 and/or internal routing features such as, for example, trenches, vias or other interconnect structures to route electrical signals through the interposer 103. For example, in some embodiments, the interposer 103 may include electrical routing features such as die bond pads (not shown) configured to receive the interconnect structures 106 disposed between the die 102 and the interposer 103 and to route electrical signals between the die 102 and the package substrate 104. The interposer 103 may be coupled with the package substrate 104 using interconnect structures 106 or any other suitable technique.

The die 102 and/or interposer 103 may represent a discrete unit made from a semiconductor material using semiconductor fabrication techniques such as thin film deposition, lithography, etching and the like. In some embodiments, the die 102 may be, include, or be a part of a processor, memory, SoC or ASIC in some embodiments. In some embodiments, an electrically insulative material such as, for example, molding compound or underfill material (not shown) may partially encapsulate a portion of the die 102, the interposer 103 and/or interconnect structures 106.

The package substrate 104 may include electrical routing features configured to route electrical signals to or from the die 102 (e.g., via the interposer 103). The electrical routing features may include, for example, traces (not shown) disposed on one or more surfaces of the package substrate 104 and/or internal routing features such as, for example, trenches, vias or other interconnect structures (not shown) to route electrical signals through the package substrate 104. For example, in some embodiments, the package substrate 104 may include electrical routing features such as bond pads (not shown) configured to receive the interconnect structures 106 of the interposer 103 and/or die and configured to route electrical signals between the die 102 and the package substrate 104.

In some embodiments, the package substrate 104 is an epoxy-based laminate substrate having a core and/or build-up layers such as, for example, an Ajinomoto Build-up Film (ABF) substrate. The package substrate 104 may include other suitable types of substrates in other embodiments including, for example, substrates formed from glass, ceramic, or semiconductor materials. The interposer 103 may include materials described in connection with the package substrate 104 in some embodiments.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1802 of FIG. 18).

Package level interconnects such as, for example, solder balls 112 may be coupled to one or more pads (hereinafter "pads 110") on the package substrate 104 and/or on the circuit board 122 to form corresponding solder joints that are configured to further route the electrical signals to between the package substrate 104 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 104 with the circuit board 122 may be used in other embodiments.

FIGS. 2a-c schematically illustrate various stages of fabrication of a hybrid carbon-metal interconnect 200 according to a first technique, in accordance with some embodiments.

Referring to FIG. 2a, a hybrid carbon-metal interconnect (hereinafter "hybrid interconnect 200") is depicted subsequent to forming a dielectric layer 216, a barrier layer 218, a metal interconnect layer 220 and graphene layer 222 on a substrate 214, as can be seen.

The substrate 214 may be composed of a wide variety of suitable materials including, for example, silicon or other semiconductor material, glass, ceramic or metal. In some embodiments, the substrate 214 may be a substrate of an interposer (e.g., interposer 103 of FIG. 1). The substrate 214 may be a substrate of another suitable component of an IC assembly in other embodiments.

The dielectric layer 216 may be formed on the substrate 214 by depositing a dielectric material using any suitable technique including, for example, atomic layer deposition (ALD), physical vapor deposition (PVD) or chemical vapor deposition (CVD) techniques. The dielectric layer 216 may be composed of any of a wide variety of suitable dielectric materials including, for example, silicon oxide (e.g., $SiO_2$), silicon carbide (SiC), silicon carbonitride (SiCN), or silicon nitride (e.g., SiN, $Si_3N_4$, etc.). Other suitable dielectric materials may be used including, for example, low-k dielectric materials having a dielectric constant k that is smaller than a dielectric constant k of silicon dioxide. In some embodiments, the dielectric layer 216 may have a thickness ranging from 50 nanometers (nm) to 300 nm. Unless otherwise specified, "thickness" as used herein may refer to a thickness in a direction perpendicular to a surface of the substrate 214 upon which the dielectric layer is formed. The dielectric layer 216 may have other thicknesses in other embodiments.

The barrier layer 218 may be formed on the dielectric layer 216 by depositing a material that is configured to inhibit diffusion of metal of the metal interconnect layer 220. In some embodiments, the barrier layer 218 may be formed by depositing tantalum (Ta), tantalum nitride (TaN), titanium (Ti), titanium nitride (TiN), titanium tungsten (TiW), tungsten nitride (WN) or ruthenium (Ru), or combinations thereof. The barrier layer 218 may be composed of multiple layers of different materials in some embodiments. In some embodiments, the barrier layer 218 may have a thickness ranging from 5 nm to 15 nm. The barrier layer 218 may include other suitable materials or thicknesses in other embodiments.

The barrier layer 218 may be deposited using any suitable deposition technique. In some embodiments, the barrier layer 218 may be deposited using a technique that provides a metal interconnect layer 220 with a (111) texture according to the convention (xyz), where x, y, and z represent respective crystallographic planes in three dimensions that are perpendicular to one another. Providing a metal interconnect layer 220 with a (111) texture may be desirable to facilitate growth of a high quality graphene layer 222 on the metal interconnect layer 220. In some embodiments, one or more barrier materials of the barrier layer 218 may be deposited using PVD to improve the quality and reliability of the graphene layer 222 and the hybrid interconnect 200. For example, a metal interconnect layer 220 formed by sputtering (e.g., PVD) may exhibit a strong (111) texture if deposited on a barrier layer 218 composed of TaN/(alpha-)Ta(bi-layer) liners deposited by PVD or TaN/Ru liners deposited by PVD or pure Ru liner deposited by PVD. The barrier layer 218 may be formed using other suitable deposition techniques in other embodiments.

In some embodiments, the hybrid interconnect 200 may not include a barrier layer 218 and/or dielectric layer 216 at all. For example, the metal interconnect layer 220 may be formed directly on the substrate 214 or directly on the dielectric layer 216 in some embodiments. FIGS. 2d-2f and FIG. 6a-1 illustrate examples of these.

The metal interconnect layer 220 may be formed by depositing a metal using any suitable technique including, for example, PVD. The deposited metal may include, for example, one or more of copper (Cu), nickel (Ni), cobalt (Co), ruthenium (Ru), iridium (Ir), platinum (Pt), or palladium (Pd). In some embodiments, the metal interconnect layer 220 may have a thickness ranging from 10 nm to 20 nm. Other suitable metals and/or thicknesses may be used to form the metal interconnect layer 220 in other embodiments.

In some embodiments, the metal interconnect layer 220 may be configured to serve as a growth initiation layer for the graphene layer 222. For example, the metal interconnect layer 220 may function as a metal substrate for catalytic nucleation or growth initiation (both referred to as "growth initiation" herein) of the graphene layer 222. The graphene layer 222 may be formed directly on the metal interconnect layer 220 and may remain on the metal interconnect layer 220 in a final product of an IC assembly (e.g., IC assembly 100 of FIG. 1).

The metal interconnect layer 220 may have a (111) texture to facilitate high quality growth of the graphene layer 222. In some embodiments, the metal interconnect layer 220 includes Cu or Ni having a (111) texture. In one embodiment, the metal interconnect layer 220 includes Cu having a (111) texture. A long range uniformity of the graphene layer 222 may be improved or increased by using a metal interconnect layer 220 of defined and uniform texture over a larger area.

The graphene layer 222 may be formed by depositing carbon on the metal interconnect layer 220. In some embodiments, the graphene layer 222 may be formed by CVD deposition. For example, growth of the graphene layer 222 on a metal interconnect layer 220 composed of Cu may be performed by CVD thermal decomposition of gas mixtures including materials such as, for example, methane ($CH_4$), ethylene $C_2H_4$, and/or hydrogen ($H_2$) at a temperature greater than or equal to 800° C. The graphene layer 222 may be formed using other suitable deposition techniques. For example, in some embodiments, the graphene layer 222 may be deposited by ALD, conversion of carbide materials (e.g., sublimation of Si out of SiC at temperature >1100° C.) or another deposition technique using non-metal initiation layers.

A thermal process temperature associated with forming the graphene layer 222 may correspond with a melting point of a metal of the metal interconnect layer 220. For example, a thermal process temperature (e.g., maximum thermal temperature) of forming the graphene layer 222 may include a temperature up to about 1000° C. for a metal interconnect layer 220 primarily composed of Cu and up to about 1450° C. for a metal interconnect layer 220 primarily composed of Ni.

The graphene layer 222 may be composed of a single/mono-layer or multiple mono-layers of carbon. The carbon may be configured in a graphene configuration such as, for example, an arrangement of graphene nanoribbons (GNRs). The graphene layer 222 may have a thickness ranging from 1 atomic layer thickness to 20 nm. In some embodiments, the graphene layer 222 may have a thickness from 5 nm to 20 nm. Other suitable thicknesses of the graphene layer 222 may be used in other embodiments.

In some embodiments, the graphene layer 222 may be doped with another material such as, for example, by intercalation of the metal interconnect layer 220 with one or more of arsenic pentafluoride ($AsF_5$), iron(III) chloride ($FeCl_3$), antimony pentafluoride ($SbF_5$) and the like. In other embodiments, the graphene layer 222 may be undoped.

Referring to FIG. 2b, the hybrid interconnect 200 is depicted subsequent to patterning. Although the substrate 214 of FIG. 2b may not be depicted in the remaining figures (except FIG. 6a), it is to be understood that the features of the remaining figures may include a substrate 214 as configured and/or described in connection with FIGS. 1 and 2a.

In some embodiments, a photosensitive material 224 (e.g., photoresist or other photodefinable material) may be deposited on the graphene layer 222 of FIG. 2a and be patterned (e.g., using an electromagnetic radiation source and/or etching) to define the hybrid interconnect 200. For example, in the depicted embodiment, the photosensitive material 224 may protect underlying materials of the layers 218, 220 and 222 during etch processes that remove portions of the layers 218, 220 and 222 that are not protected by the photosensitive material. In some embodiments, the etching may stop at the dielectric layer 216 (or the substrate 214 in a case where the dielectric layer 216 does not intervene between the substrate 214 and the hybrid interconnect 200).

In some embodiments, the etch processes may include dry etching of the graphene layer 222 (e.g., using oxygen plasma) and dry or wet etching of the metal interconnect layer 220 and/or the barrier layer 218. Other suitable etch techniques or chemistries may be used in other embodiments.

Referring to FIG. 2c, the hybrid interconnect 200 is depicted subsequent to removing the photosensitive material 224 of FIG. 2a. The photosensitive material 224 may be removed, for example, using a wet strip process that is selective to the graphene layer 222. According to various embodiments, formation of the hybrid interconnect 200 according to the first technique described in connection with FIGS. 2a-c may provide a configuration where the graphene layer 222 is deposited only on a top surface of the metal interconnect layer 220, as can be seen. The metal interconnect layer 220 and/or the graphene layer 222 may be patterned to form a line structure (e.g., in and out of the page of the figures) such as, for example, a trench structure (e.g., a trench filled with electrically conductive material) in some embodiments. In accordance with the first technique, material of the graphene layer 222 may be in direct contact with only the top surface of the metal interconnect layer 220 and not in direct contact with side surfaces (e.g., sidewalls) of the metal interconnect layer 220, as can be seen.

FIGS. 3a-b schematically illustrate various stages of fabrication of a hybrid carbon-metal interconnect (hereinafter "hybrid interconnect 300") according to a second technique, in accordance with some embodiments. The hybrid interconnect 300 may generally comport with embodiments described in connection with hybrid interconnect 200 unless otherwise specified.

Referring to FIG. 3a, a hybrid interconnect 300 is depicted subsequent to patterning of the metal interconnect layer 220 and the barrier layer 218. For example, in contrast to the first technique of FIGS. 2a-c, the graphene layer 222 in the second technique may not be deposited until after patterning is performed. Prior to patterning in the second technique, the hybrid interconnect 300 of FIG. 3a may be similarly configured as the hybrid interconnect 200 of FIG. 2a, except without the graphene layer 222. Similar techniques to pattern and remove portions of the metal interconnect layer 220 and barrier layer 218 as described in connection with FIG. 2b may be used to pattern and remove portions of the metal interconnect layer 220 and barrier layer 218 of FIG. 3a.

Referring to FIG. 3b, the hybrid interconnect 300 is depicted subsequent to depositing the graphene layer 222 on the patterned metal interconnect layer 220 and/or the barrier layer 218, as can be seen. The material of the graphene layer 222 may be deposited in accordance with techniques described in connection with FIG. 2a including for example, selective deposition using the metal interconnect layer 220 as a growth initiation layer for the graphene layer 222. In some embodiments, the graphene layer 222 may be conformally deposited on the metal interconnect layer 220. As can be seen, the graphene layer 222 may be in direct contact with a top surface and side surfaces of the metal interconnect layer 220. The metal interconnect layer 220 and the graphene layer 222 may form a line structure in some embodiments.

Figure 4:
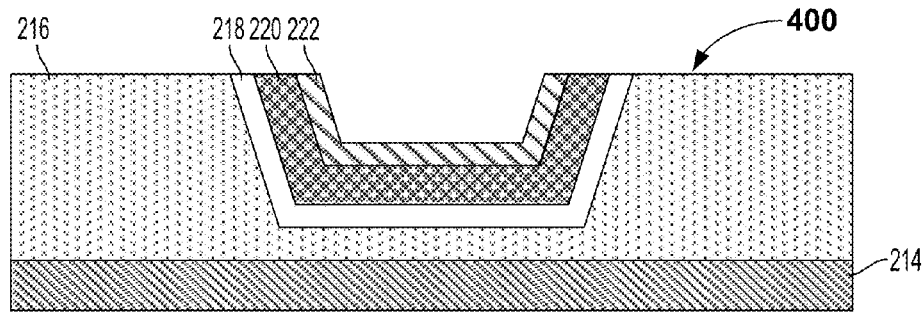
FIG. 4 schematically illustrates an example configuration of a hybrid carbon-metal interconnect, in accordance with some embodiments.

FIG. 4 schematically illustrates an example configuration of a hybrid carbon-metal interconnect (hereinafter "hybrid interconnect 400"), in accordance with some embodiments. The hybrid interconnect 400 is a damascene trench structure in some embodiments. A trench opening may be formed in the dielectric layer 216 using any suitable technique including a patterning process such a lithography and/or etch process. Material of the barrier layer 218, the metal interconnect layer 220 and the graphene layer 222 may be deposited in the trench opening, as can be seen. In some embodiments, the graphene layer 222 may be selectively deposited on metal of the metal interconnect layer 220 or may be generally deposited on a metal interconnect layer 220 (e.g., over a full wafer area) and subsequently planarized using, for example, a chemical-mechanical polishing (CMP) process to remove portions of the layers 218, 220 and/or 222 that are not in the trench opening.

Figure 5:
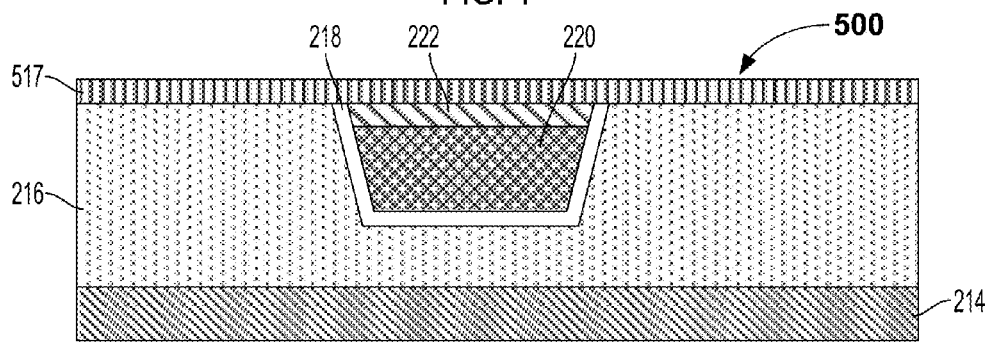
FIG. 5 schematically illustrates another example configuration of a hybrid carbon-metal interconnect, in accordance with some embodiments.

FIG. 5 schematically illustrates another example configuration of a hybrid carbon-metal interconnect (hereinafter "hybrid interconnect 500"), in accordance with some embodiments. The hybrid interconnect 500 is a damascene trench structure in some embodiments. According to various embodiments, the hybrid interconnect 500 may have a smaller dimension (e.g., line width) than the hybrid interconnect 400. The hybrid interconnect 500 may be formed by selectively depositing graphene on the metal interconnect layer 220. A dielectric cap layer 517 (e.g., SiN, SiC, SiCN, etc.) may be deposited on the graphene layer 222 and may serve as an additional diffusion barrier for the metal of the metal interconnect layer 220.

Figure 6A:
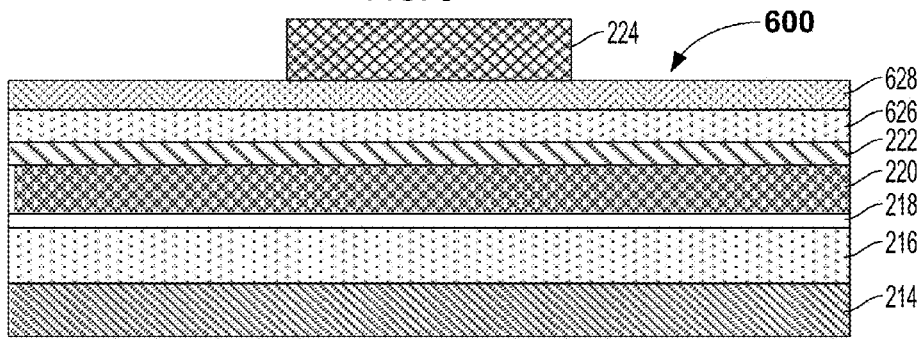
FIGS. 6a-j schematically illustrate various stages of fabrication of multi-level hybrid carbon-metal interconnects, in accordance with some embodiments.
Figures 1, 6A:
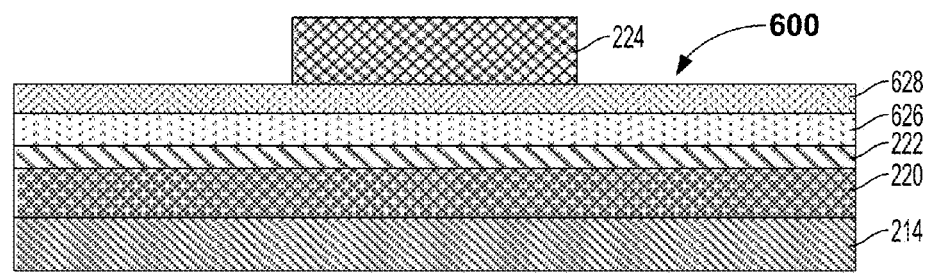
Figure 6B:
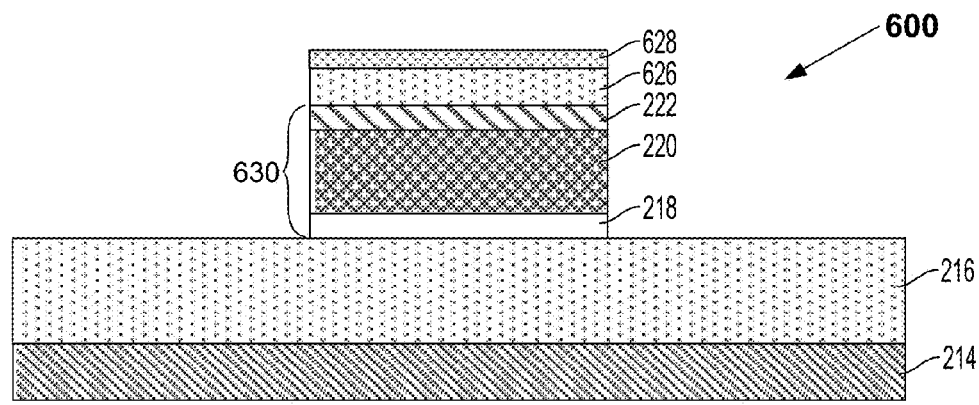
Figure 6C:
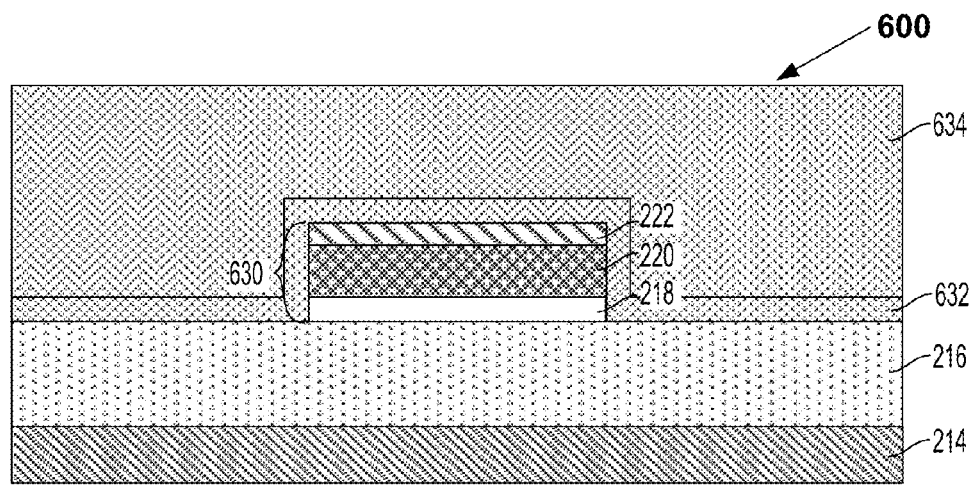
Figure 6D:
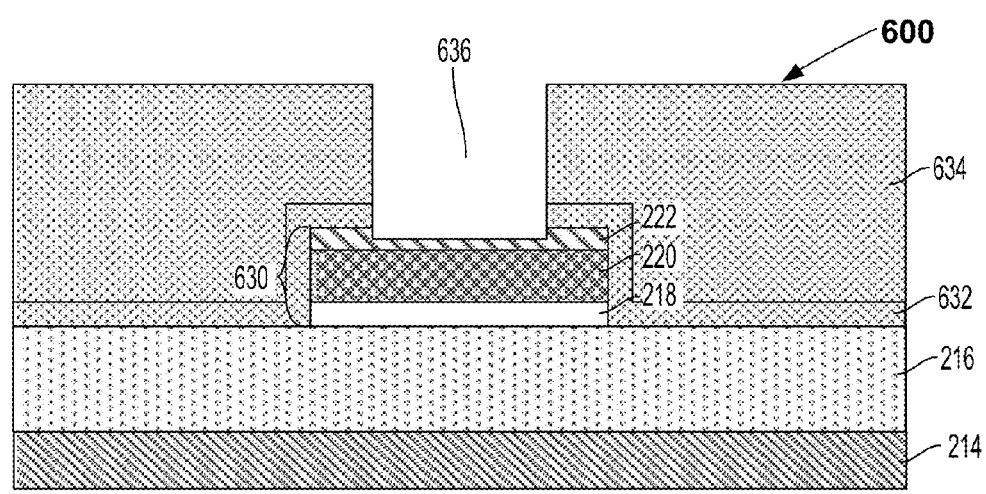
Figure 6E:
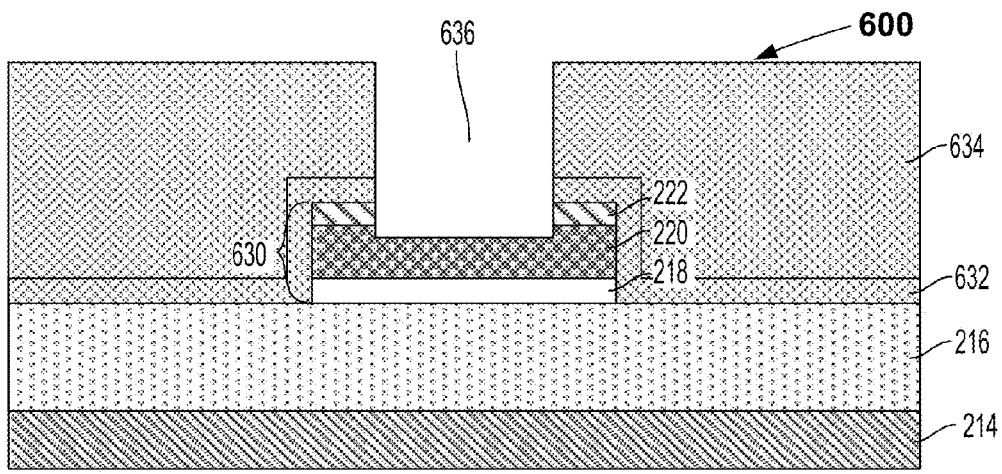
Figure 6F:
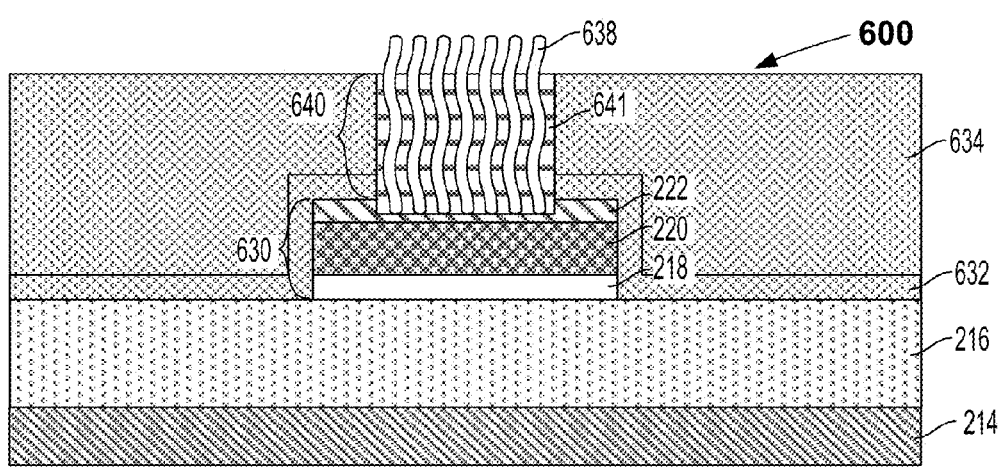
Figure 6G:
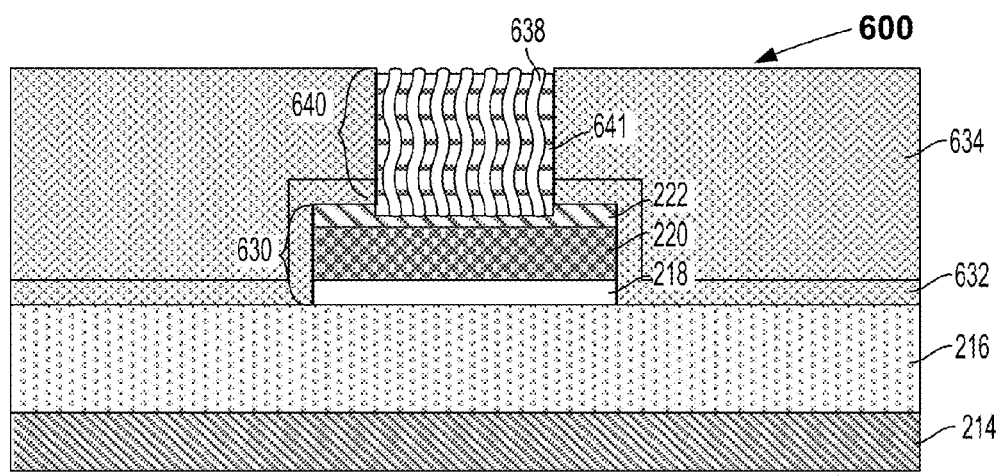
Figure 6H:
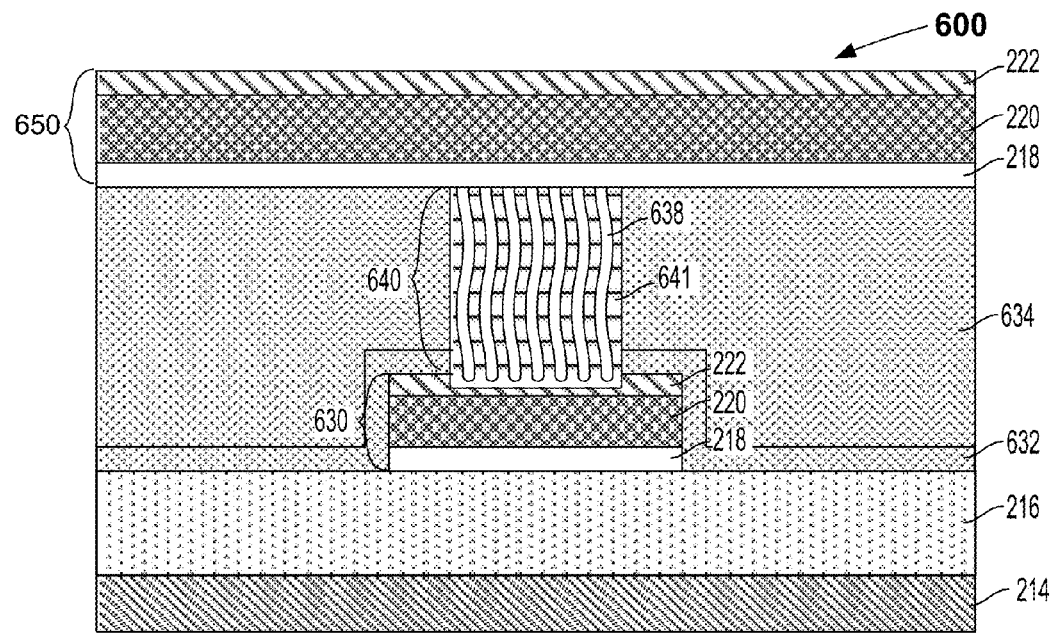
Figure 6I:
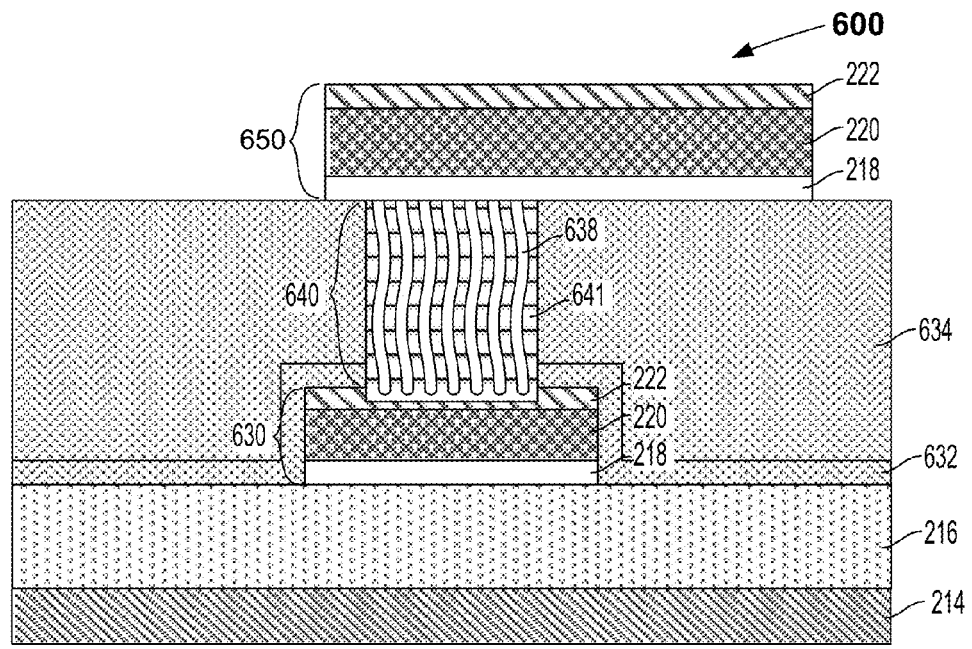
Figure 6J:
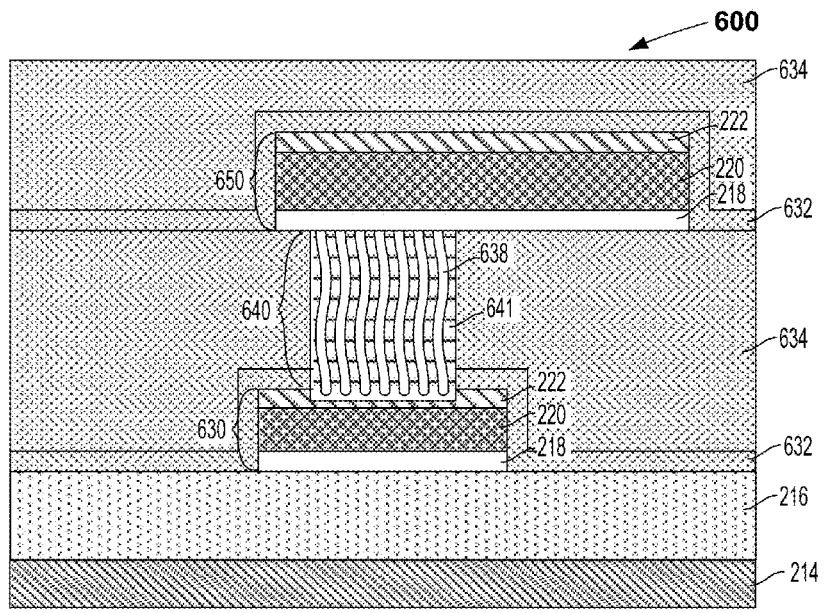

FIGS. 6a-j schematically illustrate various stages of fabrication of multi-level hybrid carbon-metal interconnects (hereinafter "multi-level hybrid interconnects 600"), in accordance with some embodiments. FIGS. 6a-c depict fabrication of a first hybrid interconnect 630, FIGS. 6d-g depict fabrication of a via structure 640 coupled with the first hybrid interconnect 630 and FIGS. 6h-j depict fabrication of a second hybrid interconnect 650 coupled with the via structure 640.

Referring to FIG. 6a, a stack of layers including, for example, dielectric layer 216, barrier layer 218, metal interconnect layer 220, graphene layer 222, first hardmask layer 626 and second hardmask layer 628 may be sequentially deposited on substrate 214 and patterned using a photosensitive material 224. The photosensitive material 224 may be deposited on the second hardmask layer 628 and portions of the photosensitive material 224 may be selectively removed (e.g., by lithography and/or etch processes) to define a mask pattern for formation of one or more hybrid interconnects (e.g., first hybrid interconnect 630) using subsequent etch processes.

A dual-hardmask configuration, as depicted, may reduce potential damage to the graphene layer 222 by processes that may be used to remove or "strip" the photosensitive material 224. For example, oxygen ($O_2$) plasma processes that may be used to remove the photosensitive material 224 may etch or otherwise damage the graphene layer 222. The first hardmask layer 626 and the second hardmask layer 628 may be composed of dielectric materials formed according to different techniques or chemistries in some embodiments. In some embodiments, the first hardmask layer 626 may include a dielectric material deposited using a deposition process without oxygen (e.g., oxygen plasma, radicals or ions) and the second hardmask layer 628 may include a dielectric material depositing using a deposition process with or without oxygen. In some embodiments, the second hardmask layer 628 may be deposited using a deposition process with oxygen (e.g., oxygen plasma, radicals or ions). For example, the first hardmask layer 626 may include silicon oxide (e.g., $SiO_2$) deposited by sputtering or spin-on process or silicon nitride (e.g., SiN, $Si_3N_4$, etc.), SiC, SiCN deposited using a deposition process (e.g., oxygen-free CVD) without oxygen plasma, radicals or ions. The second hardmask layer 628 may include silicon oxide deposited by CVD using oxygen plasma, radicals or ions. In some embodiments, the second hardmask layer 628 may include silicon nitride, SiC, SiCN deposited using any suitable deposition process. In some embodiments, the hardmask layers 626, 628 may be composed of conductive materials or metals such as, for example, TiN, TiW, Ta, TaN, etc., or a combination of dielectrics and conductive hardmask materials.

Referring to FIG. 6b, the second hardmask layer 628, the first hardmask layer 626, the graphene layer 222, the metal interconnect layer 220 and the barrier layer 218 may be etched to form the first hybrid interconnect structure 630. In some embodiments, the first hybrid interconnect structure 630 may be a line structure.

In some embodiments, the second hardmask layer 628 may be etched first using, for example, a dry etching process selective to the first hardmask layer 626 where the photosensitive material 224 of FIG. 6a is configured to protect a portion or portions of the second hardmask layer 628 that are not removed. Subsequent to etching the second hardmask layer 628, the photosensitive material 224 may be removed using any suitable technique including, a wet and/or plasma etch process using oxygen process (e.g., with oxygen plasma, radicals or ions) where the first hardmask layer 626 is configured to protect the graphene layer 222 during removal of the photosensitive material 224.

Subsequent to removing the photosensitive material 224, the portion(s) of the second hardmask layer 628 that are not removed may be used as a hardmask during etching of the first hardmask layer 626. In some embodiments, portion(s) of the first hardmask layer 626 that are not protected by the second hardmask layer 628 may be etched using any suitable etch process including, for example, dry etching processes.

Subsequent to removing the portion(s) of the first hardmask layer 626, the portion(s) of the second hardmask layer 628 and/or first hardmask layer 626 that are not removed may be used as a hardmask during etching of the graphene layer 222, the metal interconnect layer 220 and the barrier layer 218. The graphene layer 222 may be etched using any suitable etch process including, for example, dry etching with oxygen plasma. The metal interconnect layer 220 and the barrier layer 218 may be etched using any suitable etch process including, for example, dry or wet etching techniques. Remaining portions of the hardmask layers 626, 628 may be subsequently removed or may remain in a final product of the IC assembly (e.g., IC assembly 100 of FIG. 1) according to various embodiments. In the remaining figures, the hardmask layers 626, 628 are depicted as being removed.

In other embodiments, a single hardmask layer may be used. For example, in one embodiment, only one of the first hardmask layer 626 or the second hardmask layer 628 may be used to define patterning of the first hybrid interconnect 630.

Referring to FIG. 6c, a dielectric layer 632 may be formed on the graphene layer 222, sidewalls of the first hybrid interconnect 630 including surfaces of the metal interconnect layer 220 and the barrier layer 218 and the dielectric layer 216, as can be seen. A dielectric layer 634 may be deposited on the dielectric layer 632, as can be seen.

In some embodiments, the dielectric layer 632 may be referred to as a "protective" dielectric layer. The dielectric layer 632 may protect the graphene from deposition processes using oxygen (e.g., oxygen plasma, radicals or ions) for deposition of the dielectric layer 634 that may damage the graphene layer 222. According to various embodiments, deposition of the dielectric layer 632 may be performed using materials and/or techniques described in connection with deposition of the first hardmask layer 626 and deposition of the dielectric layer 634 may be performed using materials and/or techniques described in connection with deposition of the second hardmask layer 628.

For example, the deposition of the dielectric layer 632 may be performed without using oxygen plasma, radicals or ions in a deposition reaction chamber. The deposition of the dielectric layer 632 may include sputtered or spin-on silicon oxide, oxygen-free CVD of silicon nitride, SiC, SiCN, and the like, or spin-on of other oxides or low-k materials, or oxygen-radical-free deposition of low-k materials. The dielectric layer 632 may be deposited to have a thickness of only a few nanometers in some embodiments (e.g., less than 5 nm). Other suitable materials, thicknesses or deposition techniques may be used in other embodiments. In some embodiments, the dielectric layer 632 may not be used at all.

The deposition of the dielectric layer 634 may be performed using any suitable technique including, for example, CVD deposition of silicon oxide, low-k materials and the like. The dielectric layer 634 may be a main inter-metal dielectric or inter-layer dielectric (ILD) disposed between the first hybrid interconnect 630 and a second hybrid interconnect (e.g., second hybrid interconnect 650 of FIG. 6i).

An opening may be formed in the dielectric layers 632, 634 to expose electrically conductive material of first hybrid interconnect 630. Referring to FIG. 6d, an opening 636 (e.g., for via structure 640) may be formed in the dielectric layers 632, 634 to expose the graphene layer 222 of the first hybrid interconnect 630, as can be seen. The opening 636 may be formed using any suitable technique, including, for example patterning processes such as, for example, lithography and/or etch processes to define and/or remove material of the dielectric layers 632, 634. A resist strip and/or clean process may be used to remove any photosensitive material used to define and/or form the opening 636.

In the depicted embodiment of FIG. 6d, the opening 636 terminates in the graphene layer 222 such that, subsequent to deposition of material of the via structure 640 in FIG. 6f, an interface is formed between material of the via structure 640 (e.g., carbon nanotubes 638 of FIG. 6f) and material of the graphene layer 222. In some embodiments, an etch process that is selective to the graphene layer 222 may be used to form the opening 636. In various embodiments, an etch process including fluorine may be used such as, for example, fluoroform (CHF$_3$)+O$_2$ or tetrafluoromethane (CF$_4$) plasma etch processes. In some embodiments, a thin etch stop layer (e.g., composed of a polymer having carbon and fluorine) may be deposited on the graphene layer 222 to facilitate stopping of the etch to form the opening 636. In other embodiments, a timed etch may be used to form the opening 636. In some embodiments, the graphene layer 222 may have a thickness (e.g., greater than or equal to 10 nm) to facilitate etch stop in the graphene layer 222. The resist strip and/or clean process may be selective to the graphene layer 222.

Referring to FIG. 6e, an opening 636 (e.g., for via structure 640) may be formed in the dielectric layers 632, 634 to expose material of the metal interconnect layer 220. The opening 636 may be formed using any suitable technique, including, for example patterning processes such as, for example, lithography and/or etch processes to define and/or remove material of the dielectric layers 632, 634 and the graphene layer 222. A resist strip and/or clean process may be used to remove any photosensitive material used to define and/or form the opening 636.

In some embodiments, an etch process that is selective to the metal interconnect layer 220 may be used to form the opening 636. In other embodiments, a timed etch may be used to form the opening 636. The resist strip and/or clean process may be selective to the metal interconnect layer 220.

In the depicted embodiment of FIG. 6e, the opening 636 terminates in the metal interconnect layer 220 such that, subsequent to deposition of material of the via structure 640, an interface is formed between material of the via structure 640 (e.g., carbon nanotubes 638 of FIG. 6f) and material of the graphene layer 222 and an interface is also formed between material of the via structure 640 and material of the metal interconnect layer 220. According to various embodiments, forming a via structure 640 that terminates in the graphene layer 222 as depicted in FIG. 6d may avoid creating multiple interfaces as described in connection with FIG. 6e, which may detrimentally create additional Schottky barrier resistance in an electrical pathway through first hybrid interconnect 630.

In the embodiment depicted and described for FIGS. 6d and 6f, the interface between material of the via structure 640 and the graphene layer 222 may beneficially provide a Schottky barrier resistance without an additional resistance from an interface between material of the via structure 640 and the metal interconnect layer 220. Although the remaining FIGS. 6f-j depict embodiments for the case where the electrically conductive material of the via structure 640 terminates in the graphene layer 222, it is to be understood that similar embodiments where the electrically conductive material of the via structure 640 terminates in the metal interconnect layer 220 are also within the scope of this disclosure.

Referring to FIG. 6f, electrically conductive material may be deposited in the opening 636 of FIG. 6d to form the via structure 640 of FIG. 6f. In the depicted embodiment, the electrically conductive material of the via structure 640 includes one or more carbon nanotubes (hereinafter "CNTs 638"). According to various embodiments, the CNTs 638 may represent bundles of single wall CNTs (SWCNTs) bundles of multi-wall CNTs (MWCNTs) and/or a single multi-wall CNT (MWCNT) such as, for example, a CNT having greater than 10 walls. The single MWCNT may be particularly beneficial for an opening (e.g., opening 636) with small diameter (e.g., less than 20 nm) where the single MWCNT may fill or substantially file the opening.

The CNTs 638 may be formed by depositing a CNT catalyst (e.g., Ni nanoparticles) on the exposed electrically conductive material (e.g., graphene layer 222) of the first hybrid interconnect 630 and selectively growing the CNTs 638 in a vertical direction. An interface may be formed between material of the CNTs 638 and material of the graphene layer 222. In the embodiment of an opening 636 formed according to FIG. 6e, an interface may be further formed between the CNTs 638 and the metal interconnect layer 220.

In some embodiments, a dielectric material 641 may be deposited to encapsulate the CNTs 638. The dielectric material 641 may be deposited to allow or facilitate planarization (e.g., by CMP) of a portion of the CNTs 638 that may protrude from the via structure 640. In an embodiment, the dielectric material 641 includes aluminum oxide ($Al_2O_3$) deposited by ALD. Other suitable materials and/or techniques may be used to deposit the dielectric material 641 in other embodiments. In some embodiments, no dielectric material 641 may be used at all.

Referring to FIG. 6g, a planarization process (e.g., CMP) may be performed to planarize electrically conductive material (e.g., CNTs 638) of the via structure 640 of FIG. 6f. In an embodiment where the dielectric material 641 is used to encapsulate the CNTs 638, an etch process may be used to recess the dielectric material 641 such that the CNTs 638 slightly protrude from the dielectric material. Such technique may facilitate electrical coupling of the CNTs 638 with a second hybrid interconnect to be formed on the via structure 640.

Referring to FIG. 6h, electrically conductive material of a second hybrid interconnect 650 may be deposited on the via structure 640 and the dielectric layer 634, as can be seen. In some embodiments, the electrically conductive material of the second hybrid interconnect 650 may include a barrier layer 218, a metal interconnect layer 220 and graphene layer 222 deposited according to embodiments described in connection with the first hybrid interconnect 630. According to various embodiments, the barrier layer 218 and/or the metal interconnect layer 220 may be in direct contact with electrically conductive material (e.g., CNTs 638) of the via structure 640.

Referring to FIG. 6i, the deposited electrically conductive material of the second hybrid interconnect 650 may be patterned to form a line structure. The barrier layer 218, metal interconnect layer 220 and/or graphene layer 222 of the second hybrid interconnect 650 may be patterned using techniques described in connection with patterning of the first hybrid interconnect 630.

Referring to FIG. 6j, dielectric layers 632 and 634 may be deposited on the second hybrid interconnect 650 using techniques described in connection with depositing dielectric layer 632 and 634 on the first hybrid interconnect 630. Alternatively, in some embodiments, a passivation layer (not shown) may be deposited on the second hybrid interconnect 650 and an opening may be formed in the passivation layer to expose the second hybrid interconnect structure 650 for further electrical coupling.

Figure 7:
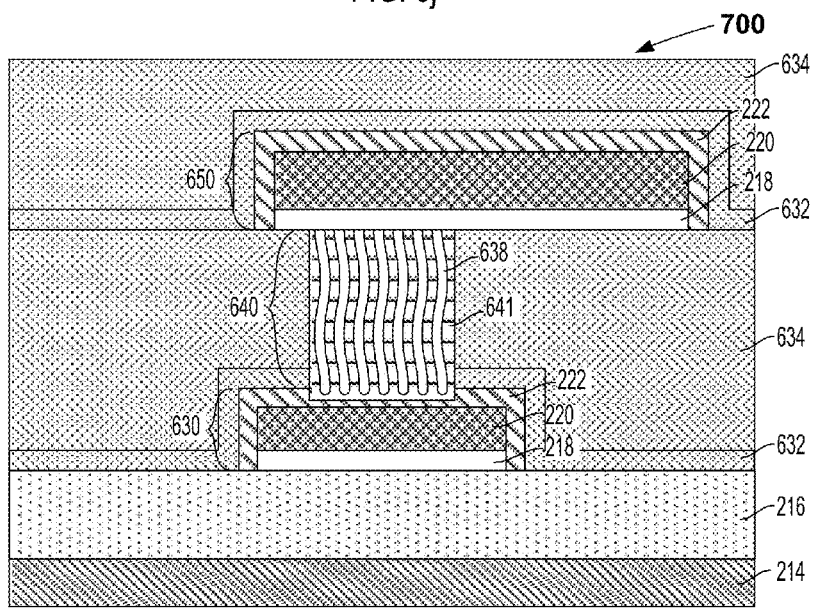
FIGS. 7-10 schematically illustrate various configurations of multi-level hybrid carbon-metal interconnects, in accordance with some embodiments.

FIGS. 7-10 schematically illustrate various configurations of multi-level hybrid carbon-metal interconnects, in accordance with some embodiments. Referring to FIG. 7, a configuration 700 is shown where the first hybrid interconnect 630 and the second hybrid interconnect 650 include a graphene layer 222 that is configured according to embodiments described in connection with FIG. 3b.

Figure 8:
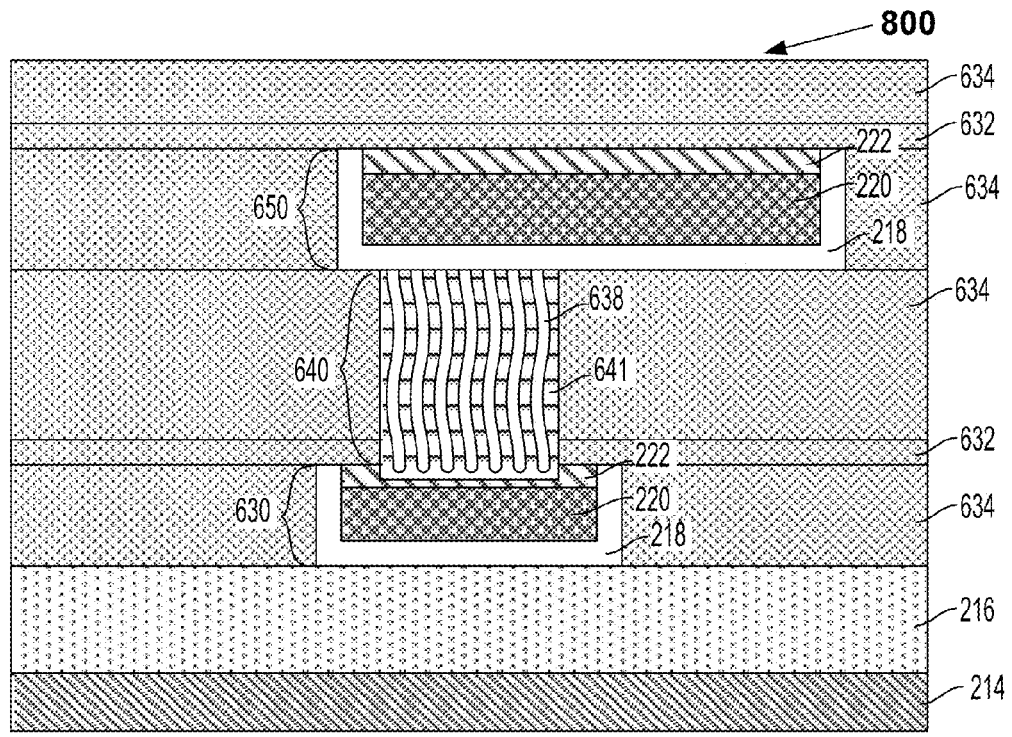

Referring to FIG. 8, a configuration 800 is shown where the first hybrid interconnect 630 and the second hybrid interconnect 650 are configured in a damascene trench arrangement as depicted and described in connection with FIG. 5. As can be seen, each of the first hybrid interconnect 630, the via structure 640 and the second hybrid interconnect 650 may be associated with or part of a corresponding dielectric layer 634 in which the interconnect structure is formed. In an embodiment, the via structure 640 and the second hybrid interconnect 650 are each part of separately formed single-damascene layers.

Figure 9:
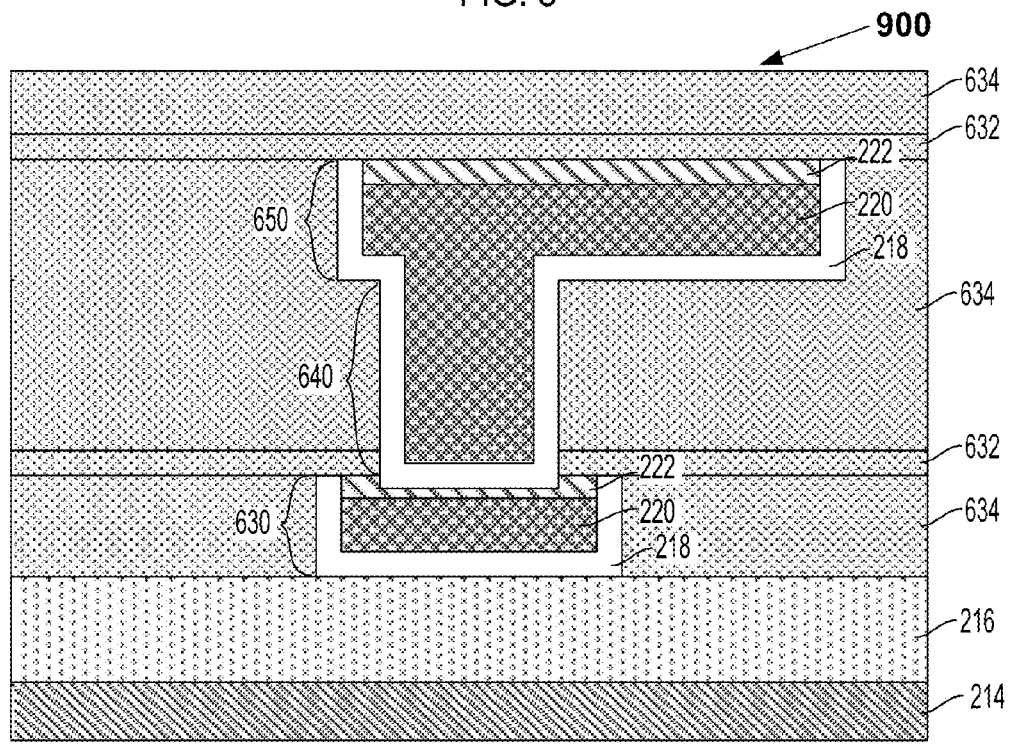

Referring to FIG. 9, a configuration 900 is shown where the via structure 640 and the second hybrid interconnect 650 are configured in a dual-damascene arrangement. In the dual-damascene arrangement, the via structure 640 and the second hybrid interconnect 650 are formed as part of a same dual-damascene layer (e.g., in dielectric layer 634). The electrically conductive material of the via structure 640 may include portions of the barrier layer 218 and/or material deposited to form the metal interconnect layer 220 of the second hybrid interconnect 650. In the embodiment depicted in FIG. 9, the via structure 640 terminates in the graphene layer 222, as can be seen.

Figure 10:
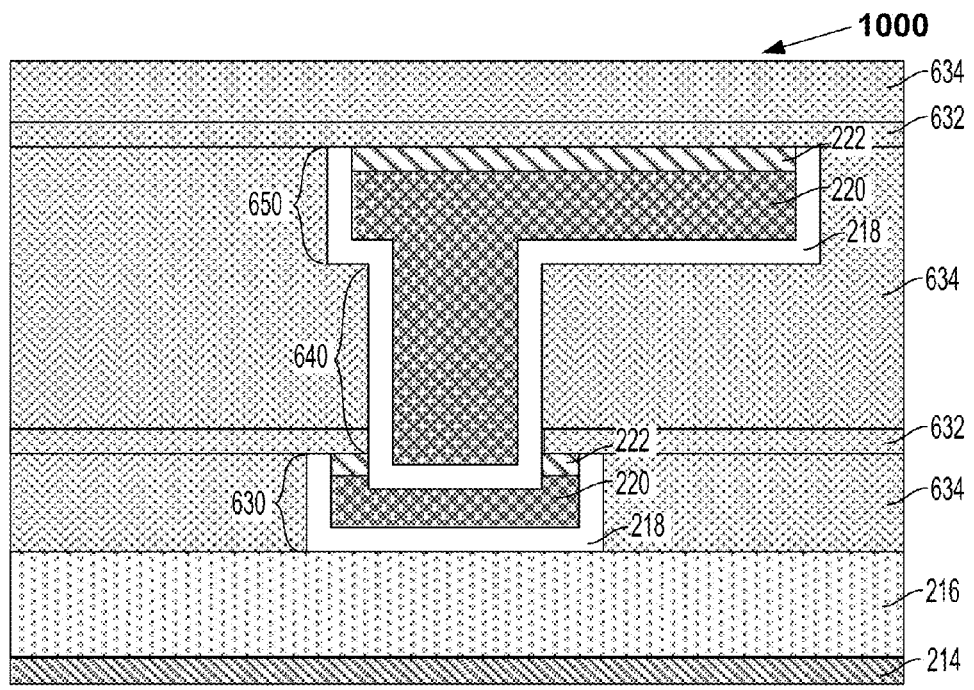

Referring to FIG. 10, a configuration 1000 is shown where the via structure 640 and the second hybrid interconnect 650 are configured in a dual-damascene arrangement similar to FIG. 9, except that the via structure 640 of FIG. 10 extends into and terminates in the metal interconnect layer 220 of the first hybrid interconnect 630, as can be seen. The scope of the present disclosure includes a wide variety of other suitable combinations of embodiments described herein.

FIGS. 11a-e schematically illustrate various stages of fabrication of a hybrid carbon-metal interconnect 1100 using a suspended portion of the graphene layer 222, in accordance with some embodiments. FIGS. 11a-e depict top views and cross-section side views of hybrid carbon-metal interconnects 1100. Similarly labeled features may comport with embodiments previously described herein.

Figure 11A:
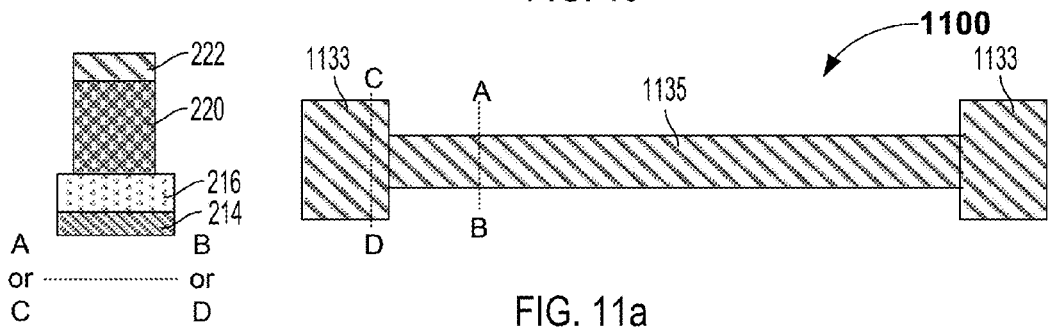
FIGS. 11a-e schematically illustrate various stages of fabrication of a hybrid carbon-metal interconnect using a suspended portion of the graphene layer, in accordance with some embodiments.

Referring to FIG. 11a, a top view of hybrid carbon-metal interconnect (hereinafter "hybrid interconnect 1100") is depicted subsequent to depositing and patterning a metal interconnect layer 220 and graphene layer 222 on dielectric layer 216, as can be seen in the cross-section view along line AB or line CD. The dielectric layer 216 is not depicted in the top view for the sake of clarity. The metal interconnect layer 220 and graphene layer 222 may be patterned according to techniques and configurations previously described herein. In some embodiments, the hybrid interconnect 1100 may include a barrier layer 218 as previously described. For example, the barrier layer 218 may be disposed between the metal interconnect layer 220 and the dielectric layer 216 or otherwise configured as described herein. In some embodiments, the dielectric layer 216 may be formed on a substrate (e.g., substrate 214) or metal interconnect layer 220 may be formed directly on the substrate (e.g., no intervening dielectric layer 216). Although not shown in the following figures, the hybrid interconnect 1100 may be formed on a substrate of a component of an IC assembly (e.g., IC assembly 100 of FIG. 1).

In some embodiments, the hybrid interconnect 1100 may include interconnect structures 1133 such as, for example, bond pads or other analogous features that provide or terminate vertical electrical routing and interconnect structure 1135 such as, for example, a trace configured to horizontally route electrical signals between the interconnect structures 1133.

Figure 11B:
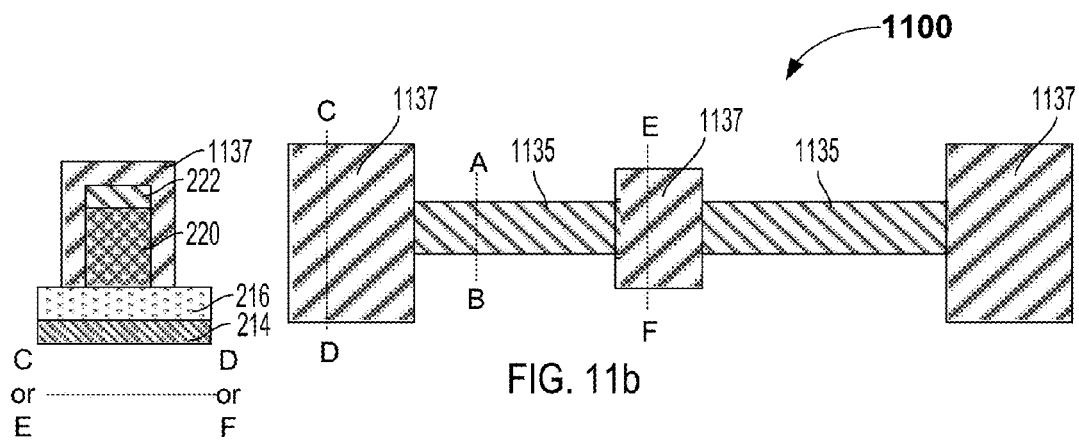

Referring to the top view in FIG. 11b, a masking material 1137 such as, for example, a photosensitive material or hardmask material may be deposited on the hybrid interconnect 1100 of FIG. 11a and patterned such that the masking material 1137 is configured to cover portions of the hybrid interconnect 1100 as can be seen, for example, in the cross-section side view along line CD or line EF. The masking material 1137 may be configured to protect portions of the hybrid interconnect 1100 from an etching process that selectively removes material of the metal interconnect layer 220. The cross-section side view along line AB for FIG. 11b is the same as the cross-section side view along line AB for FIG. 11a. In the depicted example of FIG. 11b, masking material 1137 is disposed on the interconnect structures 1133 of FIG. 11a and on a portion of the interconnect structure 1135 of FIG. 11a.

Figure 11C:
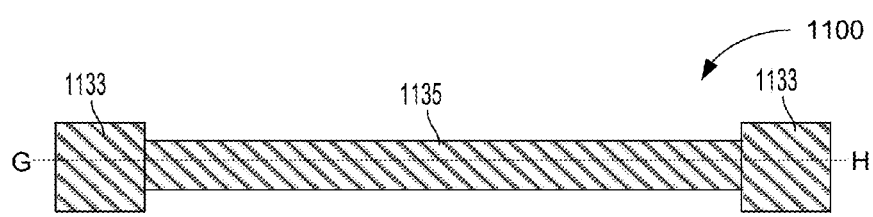
Figure 11D:
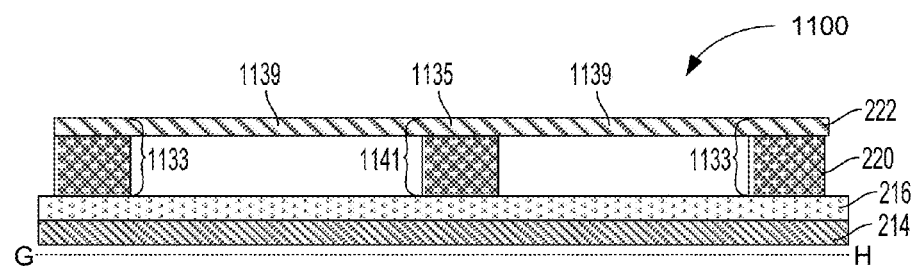

In FIG. 11c, a top view of the hybrid interconnect 1100 is depicted subsequent to using an etch process to selectively remove portions of the metal interconnect layer 220 that are not protected by the masking material 1137 of FIG. 11b and subsequent to removal of the masking material 1137. FIG. 11d depicts a cross-section side view of the hybrid interconnect 1100 of FIG. 11c along line GH. Referring to both figures FIG. 11c and FIG. 11d, removal of portions of the metal interconnect layer 220 may provide a suspended graphene portion 1139 over a region where metal of the metal interconnect layer 220 has been removed, as can be seen, the suspended graphene portion 1139 may extend in a direction within a plane of the graphene layer 222.

The suspended graphene portion 1139 may provide horizontal electrical routing (e.g., in a direction within a plane of the graphene layer 222) between interconnect structures 1133. As can be seen, removal of the portions of the metal interconnect layer 220 forms discrete interconnect structures (e.g., 1133, 1141) in the metal interconnect layer 220 that are electrically coupled by the suspended graphene portion 1139. The interconnect structure 1141 may be formed to provide structural support for the suspended graphene portion 1139 between the interconnect structures 1133. In some embodiments, the interconnect structure 1141 may further provide vertical electrical routing to the graphene layer 222 or function as a bond pad similar to interconnect structures 1133.

According to various embodiments, any suitable etch process may be used to selectively remove portions of the metal interconnect layer 220. For example, in an embodiment where the metal interconnect layer 220 is substantially composed of Cu, the etch process may include an isotropic wet etch process using ammonium persulphate (($NH_4$)$_2$$S_2O_8$). Other suitable etch techniques or chemistries may be used in other embodiments. For example, a timed etch may be used in some embodiments. The masking material 1137 may be removed using, for example, any suitable resist strip process that is selective to the graphene layer 222.

Figure 11E:
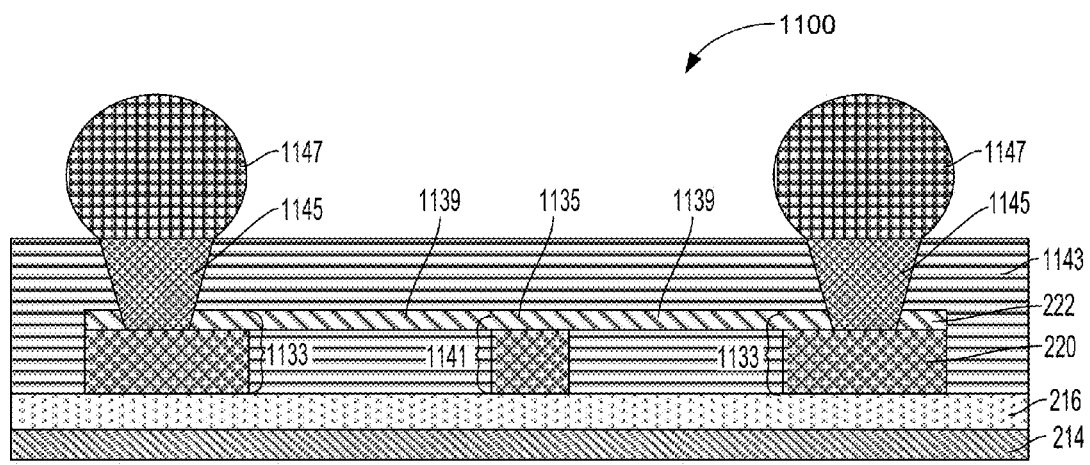

In FIG. 11e, the hybrid interconnect 1100 is depicted subsequent to formation of dielectric layer 1143, under-bump metallization (UBM) 1145 and bumps 1147. In some embodiments, the dielectric layer 1143 may be formed by depositing (e.g., spin-on) a dielectric material to encapsulate and/or underfill the graphene layer 222. The dielectric layer 1143 may include, for example, photosensitive material such as, for example, a photodefinable—imide such as polyimide. The dielectric layer 1143 may be composed of other suitable materials and may be deposited according to other suitable techniques in other embodiments.

The dielectric layer 1143 may be patterned with openings to expose the interconnect structures 1133 and electrically conductive material may be deposited in the openings to form UBM 1145 on the interconnect structures 1133. In some embodiments, the UBM 1145 may be include copper pillars. The UBM 1145 may include other materials and/or structures in other embodiments.

Bumps 1147 may be formed on the UBM 1145 to electrically couple a component (e.g., interposer 103 of FIG. 1) of an IC assembly with other components of the IC assembly. For example, the interconnect structures 106 of FIG. 1 may include bumps 1147. The bumps 1147 may be composed of solder bumps, Cu-pillar bumps or other suitable configuration. The bumps 1147 may be used to couple the component with a package substrate (e.g., laminate), a circuit board, an interposer (e.g., 2.5 D interposer) or three dimensional (3D) chip stack in some embodiments.

Figure 12A:
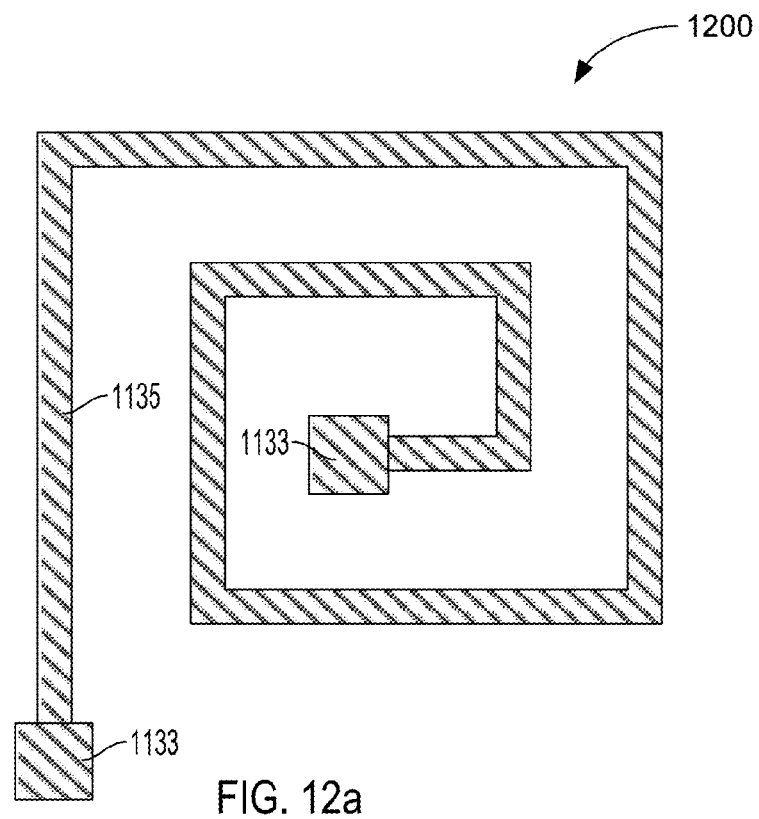
Figure 12B:
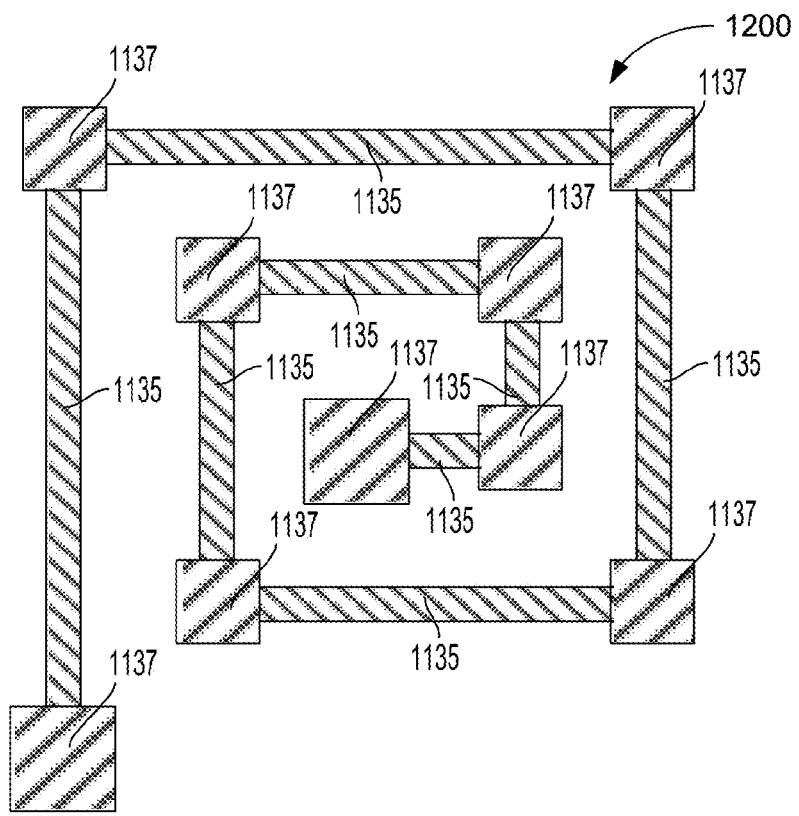

FIGS. 12a-c schematically illustrate various stages of fabrication of hybrid carbon-metal interconnects (hereinafter "hybrid interconnect 1200") in a spiral coil configuration using a suspended portion of the graphene layer, in accordance with some embodiments. The hybrid interconnect 1200 may be formed according to embodiments described in connection with the hybrid interconnect 1100. Owing to the reduced "skin effect" in graphene, a suspended graphene spiral coil may have improved high frequency behavior (e.g., higher Q-factor) compared to equivalent spiral coils built from other materials such as copper or aluminum.

In FIG. 12a, the hybrid interconnect 1200 may have a cross-section profile similar to the cross-section side view along lines AB and CD of respective interconnect structures 1135 and 1133 of FIG. 11a. In FIG. 12b, portions of the hybrid interconnect 1200 may be covered with masking material 1137 as described in connection with FIG. 11b. In the depicted example embodiment of the hybrid interconnect 1200, corners of the spiral configuration are covered with masking material 1137. In FIG. 12c, portions of the metal interconnect layer that are not protected by the masking material 1137 are selectively removed by an etch process as described in connection with FIGS. 11c-d to provide suspended graphene portion 1139 between interconnect structures 1133 and 1141.

The interconnect structures 1133 and 1141 include portions of the metal interconnect layer beneath the graphene layer that provide structural support and/or electrical routing to the suspended graphene portion 1139. In some embodiments, the interconnect structures 1133 and 1141 are part of an electrical pathway configured in a spiral coil formation that is in a plane of the metal interconnect layer and the graphene layer. In some embodiments, the interconnect structures 1133 are bond pads and the interconnect structures 1141 are support structures.

FIGS. 13-14 schematically illustrate a hybrid carbon-metal wire, in accordance with some embodiments. In FIG. 13, a cross-section profile of hybrid wire 1300 is depicted. The hybrid wire 1300 may include a metal wire 1351, graphene layer 1322 and electrically insulative cover 1357, configured as can be seen. In some embodiments, the electrically insulative cover 1357 may not be used.

In some embodiments, the metal wire 1351 may be a copper core enclosed by the graphene layer 1322. The hybrid wire 1300 or cable may be configured to reduce a "skin effect" for higher frequency RF applications (e.g., 500 kHz-10 GHz), where electrical current is transported primarily in a surface region (skin) of the conductive material for increasing frequencies of the electrical current. The graphene layer 1322 may mitigate the "skin effect" in such cases. In some embodiments, the graphene layer 1322 is a doped lower resistive graphene layer. At higher frequencies, the current may be primarily conducted in the lower resistive graphene layer 1322.

In some embodiments, the metal wire 1351 may be used to couple a computing device (e.g., computing device 1800 of FIG. 18) or other electrical device configured to output RF signals with another computing device or electrical device configured to receive the RF signals. In some embodiments the metal wire 1351 may be used to couple a tuner to a speaker or a music player (e.g., CD player) or to couple electrical measuring equipment with an RF device and the like. In some embodiments, the metal wire 1351 may be used as wirebond wires in chip assembly, RF wires in inductor coils (e.g., surface mount device (SMD)), or discrete semiconductor components. The metal wire 1351 may be used in other suitable applications in other embodiments.

In FIG. 14, a cross-section profile of hybrid wire 1400 is depicted. The hybrid wire 1400 may include a metal wire 1351, graphene layer 1322, dielectric insulator 1353, metal shield 1355 and electrically insulative cover 1357, as can be seen. The graphene layer 1322 may be configured to reduce a "skin effect" in the hybrid wire 1400.

Figure 15:
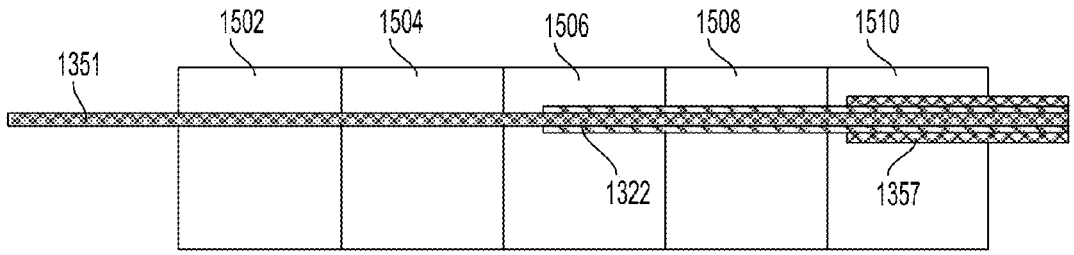
FIG. 15 schematically illustrates various stages of fabrication of a hybrid carbon-metal wire, in accordance with some embodiments.

FIG. 15 schematically illustrates various stages of fabrication of a hybrid carbon-metal wire (e.g., hybrid wire 1300 of FIG. 13), in accordance with some embodiments. At 1502, fabrication may include cleaning of incoming metal wire 1351, which may be a metal core composed of copper in some embodiments. The cleaning may be performed at a cleaning station by wet or plasma etch to remove surface oxides from the metal core.

At 1504, fabrication may further include heating of the metal wire 1351 in an inert or reducing (e.g., $H_2$) environment. The heating may be performed at a heating station by lamp heating or other suitable heat source. The inert or reducing environment may include, for example, Ar, $N_2$, $H_2$ or suitable combinations thereof.

At 1506, fabrication may further include coating the metal wire 1351 with a graphene layer 1322. The graphene layer 1322 may be deposited, for example, by CVD. In some embodiments, the graphene layer 1322 may be deposited at a temperature greater than 800° C. using chemistry such as, for example, $CH_4$, $C_2H_2$, $H_2$ and the like.

At 1508, fabrication may further include cooling down the metal wire 1351 and graphene layer 1322. Cooling down may be performed at a cool down station with temperatures less than 300° C. in an inert or reducing environment as described in connection with 1504. Although not shown in the figures, at this stage, the graphene layer 1322 may be doped by intercalation to reduce resistivity in some embodiments.

At 1510, fabrication may further include coating of the graphene layer 1322 with a dielectric coating (e.g., electrically insulative cover 1357). In some embodiments, the dielectric coating may be a dielectric insulator (e.g., dielectric insulator 1353 of FIG. 14) and a metal shield (e.g., metal shield 1355 of FIG. 14) may be formed on the dielectric insulator followed by coating with an electrically insulative cover 1357.

Figure 16:
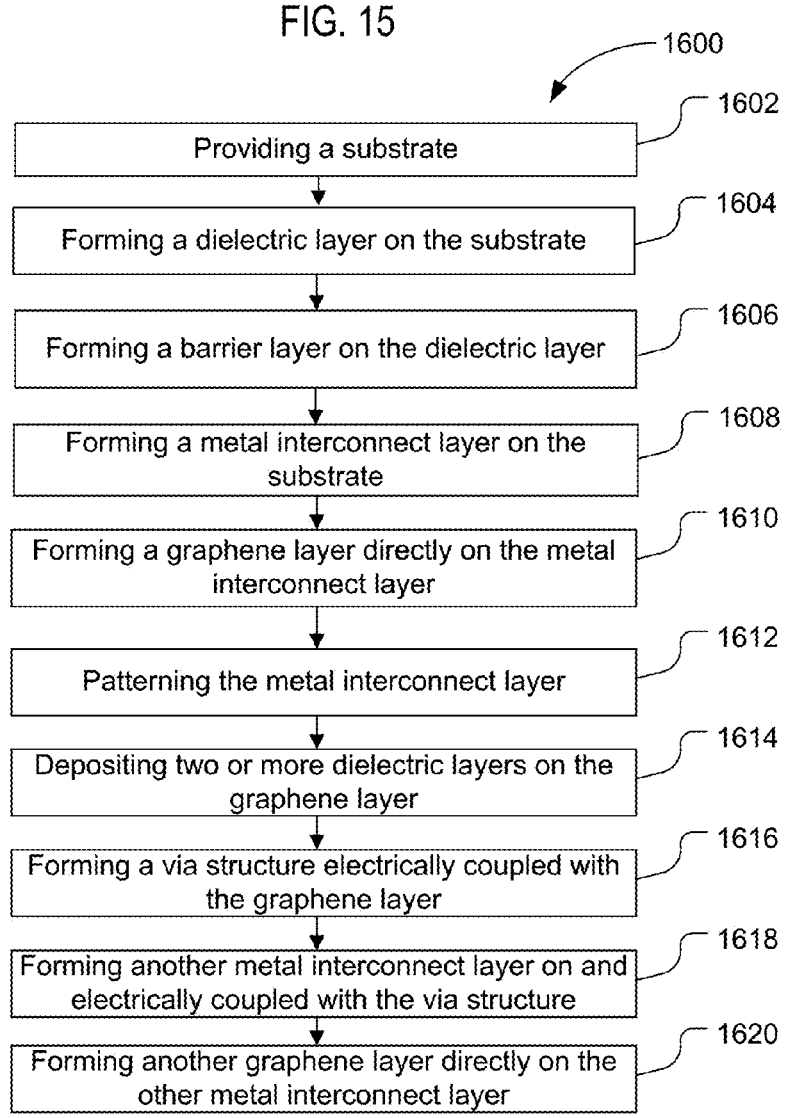
FIG. 16 schematically illustrates a flow diagram for a method of fabricating hybrid carbon-metal interconnects, in accordance with some embodiments.

FIG. 16 schematically illustrates a flow diagram for a method 1600 of fabricating hybrid carbon-metal interconnects, in accordance with some embodiments. The method 1600 may comport with embodiments described in connection with FIGS. 1 through 12c.

At 1602, the method 1600 may include providing a substrate (e.g., substrate 214 of FIG. 2a or 6a). The substrate may be part of a component of an IC assembly such as, for example, an interposer. The substrate may not include any active transistor devices formed on the substrate. In some embodiments, the substrate may include one or more passive devices formed on the substrate.

At 1604, the method 1600 may include forming a dielectric layer (e.g., dielectric layer 216 of FIG. 2a or 6a) on the substrate. The dielectric layer may be directly coupled with the substrate in some embodiments. In other embodiments, the dielectric layer may be an inter-dielectric layer (ILD) of the component.

At 1606, the method 1600 may include forming a barrier layer (e.g., barrier layer 218 of FIG. 2a or 6a) on the dielectric layer. The barrier layer may be formed according to previously described techniques.

At 1608, the method 1600 may include forming a metal interconnect layer (e.g., metal interconnect layer 220 of FIG. 2a or 6a) on the substrate. The metal interconnect layer may be formed according to previously described techniques.

At 1610, the method 1600 may include forming a graphene layer (e.g., graphene layer 222 of FIG. 2a or 6a) directly on the metal interconnect layer. The metal interconnect layer may serve as a growth initiation layer for the graphene layer. The metal interconnect layer and the graphene layer may be configured to route electrical signals through the component. In some embodiments, forming the graphene layer includes depositing one or more mono-layers of GNRs on the metal interconnect layer at a temperature greater than or equal to 800° C.

At 1612, the method 1600 may include patterning the metal interconnect layer. In some embodiments, the metal interconnect layer may be patterned to form a line structure (e.g., trench structure) or may otherwise be patterned according to previously described techniques.

At 1614, the method 1600 may include depositing two or more dielectric layers (e.g., dielectric layer 632 and dielectric layer 634 of FIG. 6c) on the graphene layer. The two or more dielectric layers may be deposited according to previously described techniques.

At 1616, the method 1600 may include forming a via structure (e.g., via structure 640 of FIG. 6f) electrically coupled with the graphene layer. The via structure may be formed according to previously described techniques.

At 1618, the method 1600 may include forming another metal interconnect layer (e.g., metal interconnect layer 220 of second hybrid interconnect 650 of FIG. 6h) on and electrically coupled with the via structure. The other metal interconnect layer may be formed on and electrically coupled with the via structure according to previously described techniques.

At 1620, the method 1600 may include forming another graphene layer (e.g., the graphene layer 222 of second hybrid interconnect 650 of FIG. 6h) directly on the other metal interconnect layer. The other graphene layer may be formed directly on the other metal interconnect layer according to previously described techniques.

Figure 17:
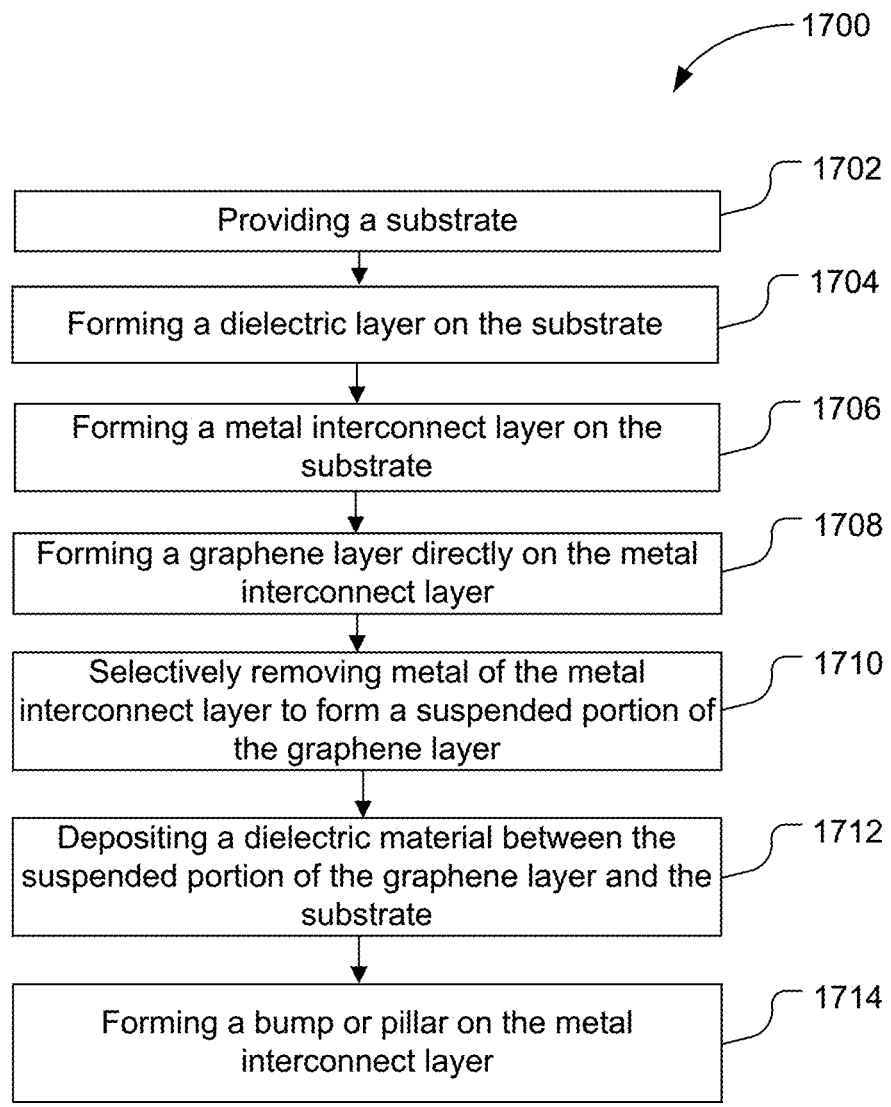
FIG. 17 schematically illustrates a flow diagram for a method of fabricating hybrid carbon-metal interconnects using a suspended portion of the graphene layer, in accordance with some embodiments.

FIG. 17 schematically illustrates a flow diagram for a method 1700 of fabricating hybrid carbon-metal interconnects (e.g., hybrid interconnect 1100 of FIGS. 11a-e or 1200 of FIGS. 12a-c) using a suspended portion (e.g., suspended graphene portion 1139 of FIGS. 11d-e or FIG. 12c) of the graphene layer, in accordance with some embodiments.

At 1702, the method 1700 may include providing a substrate. At 1704, the method 1700 may include forming a dielectric layer on the substrate. At 1706, the method 1700 may include forming a metal interconnect layer on the substrate. At 1708, the method 1700 may include forming a graphene layer directly on the metal interconnect layer. Actions at 1702, 1704, 1706 and 1708 may comport with embodiments described in connection with respective actions 1602, 1604, 1608 and 1610 of FIG. 16. In some embodiments, a barrier layer may be formed in the method 1700 similar as described in connection with the method 1600. The method 1700 may further include patterning the metal interconnect layer as described in connection with 1612 of method 1600.

At 1710, the method 1700 may include selectively removing metal of the metal interconnect layer to form a suspended portion of the graphene layer. Selectively removing the metal of the metal interconnect layer may form at least two metal interconnect structures (e.g., interconnect structures 1133 and/or 1141 of FIG. 11d) in the metal interconnect layer that are electrically coupled by a suspended portion of the graphene layer.

At 1712, the method 1700 may further include depositing a dielectric material (e.g., dielectric material 1143 of FIG. 11e) between the suspended portion of the graphene layer and the substrate. Depositing the dielectric material between the suspended portion of the graphene layer and the substrate may be performed by spin-on, underfill dispense techniques or other techniques described herein. Other suitable techniques may be used in other embodiments.

At 1714, the method 1700 may further include forming a bump or pillar on the metal interconnect layer. For example, in some embodiments, forming the bump or pillar on the metal interconnect layer may include techniques described in connection with forming UBM 1145 and/or bumps 1147 of FIG. 11e. In some embodiments, the method 1700 may be used to form an electrical pathway (e.g., hybrid interconnect 1200) configured in a spiral coil formation (e.g., as depicted in FIG. 12c). Techniques described in connection with methods 1600 and 1700 may be suitably combined in various embodiments.

Various operations are described as multiple discrete operations in turn, in a manner that is most helpful in understanding the claimed subject matter. However, the order of description should not be construed as to imply that these operations are necessarily order dependent. Actions of the method 1600 or 1700 may be performed in another suitable order than depicted.

Figure 18:
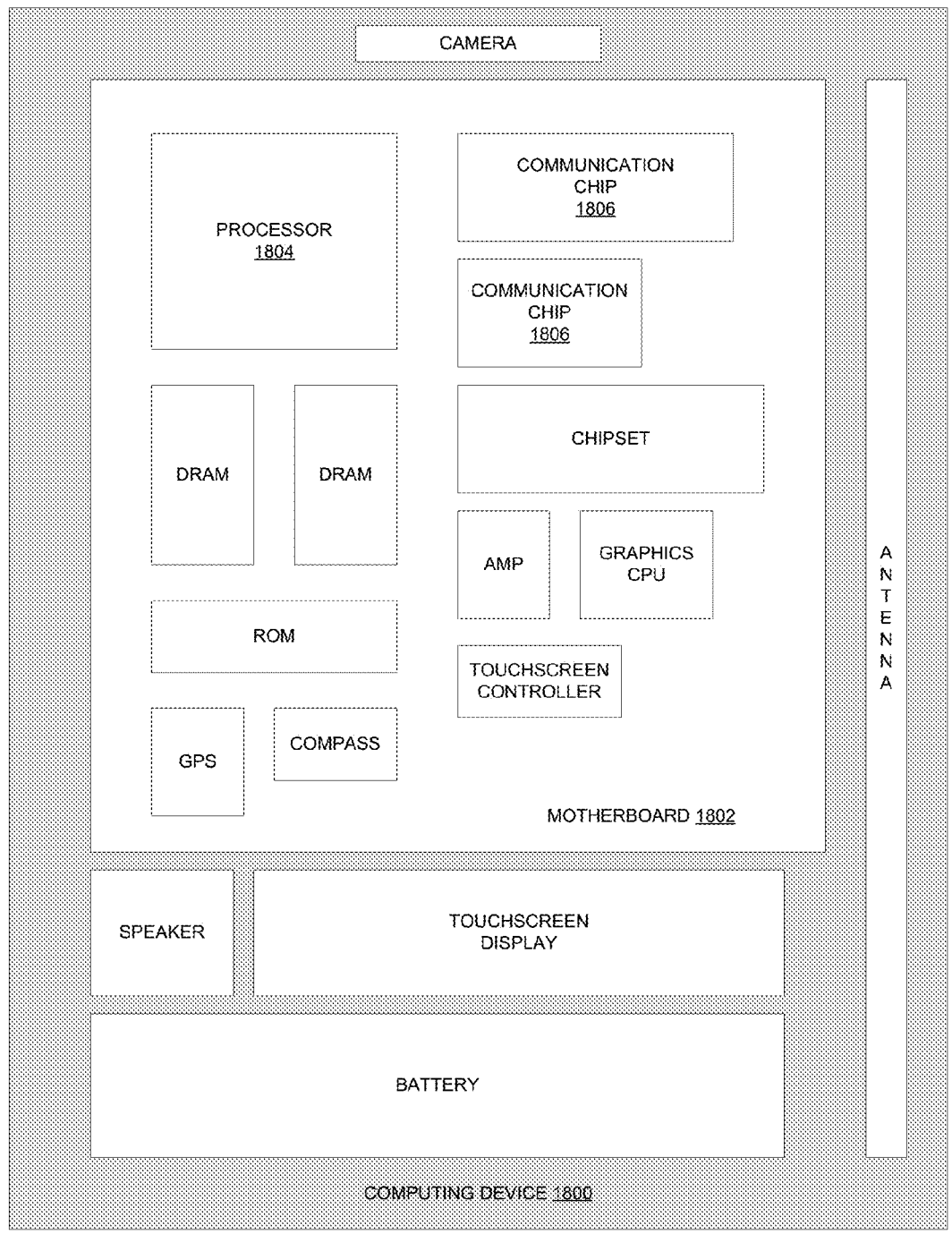
FIG. 18 schematically illustrates a computing device that includes hybrid carbon-metal interconnects as described herein, in accordance with some embodiments.

Embodiments of the present disclosure may be implemented into a system using any suitable hardware and/or software to configure as desired. FIG. 18 schematically illustrates a computing device that includes hybrid carbon-metal interconnects as described herein, in accordance with some embodiments. The computing device 1800 may house a board such as motherboard 1802. The motherboard 1802 may include a number of components, including but not limited to a processor 1804 and at least one communication chip 1806. The processor 1804 may be physically and electrically coupled to the motherboard 1802. In some implementations, the at least one communication chip 1806 may also be physically and electrically coupled to the motherboard 1802. In further implementations, the communication chip 1806 may be part of the processor 1804.

Depending on its applications, computing device 1800 may include other components that may or may not be physically and electrically coupled to the motherboard 1802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1806 may enable wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1806 may operate in accordance with other wireless protocols in other embodiments.

The computing device 1800 may include a plurality of communication chips 1806. For instance, a first communication chip 1806 may be dedicated to shorter range wireless communications such as Wi-Fi and Bluetooth and a second communication chip 1806 may be dedicated to longer range wireless communications such as GPS, EDGE, GPRS, CDMA, WiMAX, LTE, Ev-DO, and others.

The processor 1804 of the computing device 1800 may be packaged in an IC assembly (e.g., IC assembly 100 of FIG. 1) that includes a component (e.g., interposer 103 of FIG. 1) having hybrid carbon-metal interconnects as described herein. For example, the circuit board 122 of FIG. 1 may be a motherboard 1802 and the processor 1804 may be a die 102 mounted on a package substrate 104 using interposer 103 of FIG. 1. The package substrate 104 and the motherboard 1802 may be coupled together using package level interconnects. The term "processor" may refer to any device or portion of a device that processes electronic data from registers and/or memory to transform that electronic data into other electronic data that may be stored in registers and/or memory.

The communication chip 1806 may also include a die (e.g., die 102 of FIG. 1) that may be packaged in an IC assembly (e.g., IC assembly 100 of FIG. 1) that includes a component (e.g., interposer 103 of FIG. 1) having hybrid carbon-metal interconnects as described herein. In further implementations, another component (e.g., memory device or other integrated circuit device) housed within the computing device 1800 may include a die (e.g., die 102 of FIG. 1) that may be packaged in an IC assembly (e.g., IC assembly 100 of FIG. 1) that includes a component (e.g., interposer 103 of FIG. 1) having hybrid carbon-metal interconnects as described herein.

In various implementations, the computing device 1800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1800 may be any other electronic device that processes data.

Examples

According to various embodiments, the present disclosure describes an apparatus or integrated circuit assembly comprising a substrate, a metal interconnect layer disposed on the substrate and configured to serve as a growth initiation layer for a graphene layer and the graphene layer, the graphene layer being formed directly on the metal interconnect layer, the metal interconnect layer and the graphene layer being configured to route electrical signals. In some embodiments, the graphene layer includes one or more mono-layers of graphene nanoribbons (GNRs). In some embodiments, the substrate is composed of one or more of a semiconductor, glass, or metal and the metal interconnect layer is composed of one or more of copper (Cu), nickel (Ni), cobalt (Co), ruthenium (Ru), iridium (Ir), platinum (Pt), or palladium (Pd).

In some embodiments, the apparatus or assembly further includes an interposer including the substrate, wherein the metal interconnect layer and the graphene layer are configured to route the electrical signals through the interposer and wherein the substrate does not include any active transistor devices formed on the substrate. In some embodiments, the interposer is an integrated passive device.

In some embodiments, the apparatus or assembly further includes a first dielectric layer disposed on the substrate and a barrier layer disposed on the first dielectric layer, wherein the barrier layer is disposed between the metal interconnect layer and the first dielectric layer, the metal interconnect layer being in direct contact with the barrier layer, a second dielectric layer disposed on the graphene layer, the second dielectric layer being in direct contact with the graphene layer and configured to protect the graphene layer during a deposition of a third dielectric layer that uses oxygen plasma, radicals or ions and the third dielectric layer disposed on the second dielectric layer, the third dielectric layer being in direct contact with the second dielectric layer. In some embodiments, the first dielectric layer, the second dielectric layer and the third dielectric layer are composed of one or more of silicon oxide, silicon carbide, silicon carbonitride, or silicon nitride and the barrier layer is composed of one or more of tantalum (Ta), tantalum nitride (TaN), titanium (Ti), titanium nitride (TiN), titanium tungsten (TiW), tungsten nitride (WN) or ruthenium (Ru). In some embodiments, material of the graphene layer is disposed on a top surface and sidewall surfaces of the metal interconnect layer. In some embodiments, the metal interconnect layer has a (111) texture. In some embodiments, the metal interconnect layer and the graphene layer form a line structure.

In some embodiments, the apparatus or assembly further includes a via structure, wherein electrically conductive material of the via structure terminates in the graphene layer. In some embodiments, apparatus or assembly further include a via structure, wherein electrically conductive material of the via structure extends through the graphene layer and terminates in the metal interconnect layer. In some embodiments, the electrically conductive material of the via structure includes carbon nanotubes (CNTs) or metal.

In some embodiments, the electrically conductive material of the via structure includes the CNTs encapsulated in a dielectric material. In some embodiments, the line structure is a first line structure, the metal interconnect layer is a first metal interconnect layer and the graphene layer is a first graphene layer and the apparatus or assembly further includes a second metal interconnect layer disposed on and electrically coupled with the via structure, the second metal interconnect layer being configured to serve as a growth initiation layer for a second graphene layer and the second graphene layer, the second graphene layer being formed directly on the second metal interconnect layer, wherein the second metal interconnect structure and the second graphene layer form a second line structure. In some embodiments, the via structure and the second line structure are each part of single-damascene layers or part of a same dual-damascene layer.

In some embodiments, the metal interconnect layer includes a region where metal of the metal interconnect layer has been removed to form at least two metal interconnect structures and the graphene layer extends in a direction within a plane of the graphene layer to provide a suspended graphene portion over the region where the metal has been removed, the suspended graphene portion being configured to electrically couple the two metal interconnect structures. In some embodiments, at least one of the two metal interconnect structures is a bond pad. In some embodiments, the apparatus or assembly further includes a dielectric material disposed in the region where the metal has been removed and a bump or pillar disposed on and electrically coupled with the bond pad. In some embodiments, the two metal interconnect structures are part of an electrical pathway configured in a spiral coil formation, the electrical pathway being in a plane of the metal interconnect layer and the graphene layer. In some embodiments, the electrical signals include input/output (I/O) signals, radio frequency (RF) signals or power routed to or from one or more dies.

According to various embodiments, the present disclosure describes a method of fabricating a hybrid carbon-metal interconnect of an integrated circuit assembly. In some embodiments, the method includes providing a substrate, forming a metal interconnect layer on the substrate and forming a graphene layer directly on the metal interconnect layer using the metal interconnect layer as a growth initiation layer for the graphene layer, the metal interconnect layer and the graphene layer being configured to route electrical signals. In some embodiments, providing the substrate comprises providing a substrate of an interposer that does not include any active transistor devices formed on the substrate and includes one or more passive devices formed on the substrate. In some embodiments, forming the graphene layer comprises depositing one or more mono-layers of graphene nanoribbons (GNRs) on the metal interconnect layer at a temperature greater than or equal to 800° C. In some embodiments, forming the metal interconnect layer comprises depositing a metal.

In some embodiments, the method further includes forming a dielectric layer on the substrate and forming a barrier layer on the dielectric layer, wherein the barrier layer is disposed between the metal interconnect layer and the dielectric layer, the metal interconnect layer being in direct contact with the barrier layer. In some embodiments, forming the metal interconnect layer comprises depositing one or more of copper (Cu), nickel (Ni), cobalt (Co), ruthenium (Ru), iridium (Ir), platinum (Pt) or palladium (Pd), the deposited metal having a (111) texture according to the convention (xyz), where x, y, and z represent respective crystallographic planes in three dimensions that are perpendicular to one another and forming the barrier layer comprises depositing (Ta), tantalum nitride (TaN), titanium (Ti), titanium nitride (TiN), titanium tungsten (TiW), tungsten nitride (WN) or ruthenium (Ru) using a physical vapor deposition (PVD) process.

In some embodiments, the dielectric layer is a first dielectric layer and the method further includes patterning the metal interconnect layer to form a line structure, forming a second dielectric layer on the graphene layer using a deposition process without oxygen plasma, radicals or ions, the second dielectric layer being in direct contact with the graphene layer and forming a third dielectric layer on the second dielectric layer, the third dielectric layer being in direct contact with the second dielectric layer. In some embodiments, patterning the metal interconnect layer includes depositing a first hardmask material on the graphene layer, depositing a second hardmask material on the first hardmask material, depositing a photodefinable material on the second hardmask material, selectively removing portions of the photodefinable material, etching the second hardmask material to remove portions of the second hardmask material that are not protected by the photodefinable material, the etching of the second hardmask material being selective to the first hardmask material, removing the photodefinable material and subsequent to removing the photodefinable material, etching the first hardmask material, the graphene layer and the metal interconnect layer to remove portions of the first hardmask material, the graphene layer and the metal interconnect layer that are not protected by the second hardmask material. In some embodiments, forming the second dielectric layer comprises depositing silicon oxide using a sputtering or spin-on process or depositing silicon carbide, silicon carbonitride, or silicon nitride using an oxygen-free chemical vapor deposition (CVD) process and forming the third dielectric layer comprises depositing silicon oxide using a CVD process, wherein the second dielectric layer is configured to protect the graphene layer from oxygen plasma, radicals or ions during formation of the third dielectric layer.

In some embodiments, forming the graphene layer comprises depositing graphene on sidewall surfaces of the metal interconnect layer. In some embodiments, the method further includes forming a via structure by removing material of the third dielectric layer and the second dielectric layer to form an opening that exposes the graphene layer and depositing electrically conductive material of the via structure on the exposed graphene layer, wherein electrically conductive material of the via structure terminates in the graphene layer. In some embodiments, the method further includes forming a via structure by removing material of the third dielectric layer, the second dielectric layer and the graphene layer to form an opening that exposes the metal interconnect layer and depositing electrically conductive material of the via structure into the opening on the exposed metal interconnect layer, wherein electrically conductive material of the via structure terminates in the metal interconnect layer. In some embodiments, depositing the electrically conductive material of the via structure comprises depositing carbon nanotubes (CNTs) and forming the via structure further comprises depositing a dielectric material to encapsulate the CNTs. In some embodiments, the method further includes performing a planarization process to provide a planar surface of the CNTs with the third dielectric layer, wherein depositing the dielectric material to encapsulate the CNTs facilitates the planarization process of the CNTs.

In some embodiments, the line structure is a first line structure, the metal interconnect layer is a first metal interconnect layer and the graphene layer is a first graphene layer and the method further includes forming a second metal interconnect layer on and electrically coupled with the via structure, forming a second graphene layer directly on the second metal interconnect layer using the second metal interconnect layer as a growth initiation layer for the second graphene layer and patterning the second metal interconnect structure to form a second line structure. In some embodiments, the via structure and the second line structure are separately formed using a single-damascene process. In some embodiments, the via structure and the second line structure are formed as part of a same layer using a dual-damascene process.

In some embodiments, the method further includes selectively removing metal of the metal interconnect layer subsequent to forming the graphene layer to form at least two metal interconnect structures in the metal interconnect layer that are electrically coupled by a suspended portion of the graphene layer. In some embodiments, at least one of the two metal interconnect structures is a bond pad and the method further includes depositing a dielectric material to fill a region between the suspended portion of the graphene layer and the substrate where the metal of the metal interconnect layer has been removed and forming a bump or pillar on and electrically coupled with the bond pad. In some embodiments, the method further includes forming an electrical pathway configured in a spiral coil formation, the two metal interconnect structures being part of the electrical pathway and the electrical pathway being in a plane of the metal interconnect layer and the graphene layer.

According to various embodiments, the present disclosure describes a hybrid carbon-metal wire ("wire"). In some embodiments, the wire includes a metal wire core and a graphene layer disposed on and configured to encapsulate the metal wire core. In some embodiments, the wire further includes an electrically insulative material disposed on and configured to encapsulate the graphene layer. In some embodiments, the electrically insulative material is a dielectric insulator and the wire further includes a metal shield layer disposed on and configured to encapsulate the dielectric insulator and an electrically insulative outer layer disposed on and configured to encapsulate the metal shield layer, wherein the wire is configured to route radio frequency (RF) signals and wherein the graphene layer is configured to reduce a skin effect of the RF signals.

According to various embodiments, the present disclosure describes a system or computing device comprising an interposer including a substrate, a metal interconnect layer disposed on the substrate and configured to serve as a growth initiation layer for a graphene layer, and the graphene layer, the graphene layer being formed directly on the metal interconnect layer and a die electrically coupled with the interposer, wherein the metal interconnect layer and the graphene layer are configured to route electrical signals of the die through the interposer. In some embodiments, the system or computing device further includes a circuit board, wherein the interposer is electrically coupled with the circuit board and the circuit board is configured to route the electrical signals of the die and one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board. In some embodiments, the system or computing device is one of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method comprising:
providing a substrate;
forming a metal interconnect layer on the substrate;
forming a graphene layer directly on the metal interconnect layer using the metal interconnect layer as a growth initiation layer for the graphene layer, the metal interconnect layer and the graphene layer being configured to route electrical signals; and
selectively removing metal of the metal interconnect layer subsequent to forming the graphene layer to form at least two metal interconnect structures in the metal interconnect layer that are electrically coupled by a suspended portion of the graphene layer.

2. The method of claim 1, wherein:
providing the substrate comprises providing a substrate of an interposer that does not include any active transistor devices formed on the substrate and includes one or more passive devices formed on the substrate; and
forming the graphene layer comprises depositing one or more mono-layers of graphene nanoribbons (GNRs) on the metal interconnect layer at a temperature greater than or equal to 800° C.

3. The method of claim 1, wherein forming the metal interconnect layer comprises depositing a metal, and the method further comprising:
forming a dielectric layer on the substrate; and
forming a barrier layer on the dielectric layer, wherein the barrier layer is disposed between the metal interconnect layer and the dielectric layer, the metal interconnect layer being in direct contact with the barrier layer.

4. The method of claim 3, wherein:
forming the metal interconnect layer comprises depositing one or more of copper (Cu), nickel (Ni), cobalt (Co), ruthenium (Ru), iridium (Ir), platinum (Pt) or palladium (Pd), the deposited metal having a (111) texture according to a convention (xyz), where x, y, and z represent respective crystallographic planes in three dimensions that are perpendicular to one another; and
forming the barrier layer comprises depositing tantalum (Ta); tantalum nitride (TaN), titanium (Ti), titanium nitride (TiN), titanium tungsten (TiW), tungsten nitride (WN) or ruthenium (Ru) using a physical vapor deposition (PVD) process.

5. The method of claim 3, wherein the dielectric layer is a first dielectric layer, and the method further comprising:
patterning the metal interconnect layer to form a line structure;
forming a second dielectric layer on the graphene layer using a deposition process without oxygen plasma, radicals or ions, the second dielectric layer being in direct contact with the graphene layer; and
forming a third dielectric layer on the second dielectric layer, the third dielectric layer being in, direct contact with the second dielectric layer.

6. The method of claim 5, wherein patterning the metal interconnect layer comprises:
depositing a first hardmask material on the graphene layer;
depositing a second hardmask material on the first hardmask material;
depositing a photodefinable material on the second hardmask material;
selectively removing portions of the photodefinable material;
etching the second hardmask material to remove portions of the second hardmask material that are not protected by the photodefinable material, the etching of the second hardmask material being selective to the first hardmask material;
removing the photodefinable material; and
subsequent to removing the photodefinable material, etching the first hardmask material, the graphene layer and the metal interconnect layer to remove portions of the first hardmask material, the graphene layer and the metal interconnect layer that are not protected by the second hardmask material.

7. The method of claim 5, wherein:
forming the second dielectric layer comprises depositing silicon oxide using a sputtering or spin-on process or depositing silicon carbide, silicon carbonitride, or silicon nitride using an oxygen-free chemical vapor deposition (CVD) process; and forming the third dielectric layer comprises depositing silicon oxide using a CVD process, wherein the second dielectric layer is configured to protect the graphene layer from oxygen plasma, radicals or ions during formation of the third dielectric layer.

8. The method of claim 5, wherein forming the graphene layer comprises depositing graphene on sidewall surfaces of the metal interconnect layer.

9. The method of claim 5, further comprising:
forming a via structure by removing material of the third dielectric layer and the second dielectric layer to form an opening that exposes the graphene layer; and
depositing electrically conductive material of the via structure on the exposed graphene layer, wherein electrically conductive material of the via structure terminates in the graphene layer.

10. The method of claim 5, further comprising:
forming a via structure by removing material of the third dielectric layer, the second dielectric layer and the graphene layer to form an opening that exposes the metal interconnect layer; and
depositing electrically conductive material of the via structure into the opening on the exposed metal interconnect layer, wherein electrically conductive material of the via structure terminates in the metal interconnect layer.

11. The method of claim 10, wherein:
depositing the electrically conductive material of the via structure comprises depositing carbon nanotubes (CNTs); and
forming the via structure further comprises depositing a dielectric material to encapsulate the CNTs, and the method further comprising:
performing a planarization process to provide a planar surface of the CNTs with the third dielectric layer, wherein depositing the dielectric, material to encapsulate the CNTs facilitates the planarization process of the CNTs.

12. The method of claim 1, wherein at least one of the two metal interconnect structures is a bond pad, and the method further comprising
depositing a dielectric material to fill a region between the suspended portion of the graphene layer and the substrate where the metal of the metal interconnect layer has been removed; and
forming a bump or pillar on and electrically coupled with the bond pad.

13. A method comprising:
providing a substrate;
forming a metal interconnect layer on the substrate; and
forming a graphene layer directly on the metal interconnect layer using the metal interconnect layer as a growth initiation layer for the graphene layer, the metal interconnect layer and the graphene layer being configured to route electrical signals,
wherein providing the substrate comprises providing a substrate of an interposer that does not include any active transistor devices formed on the substrate and includes one or more passive devices formed on the substrate, and
wherein forming the graphene layer comprises depositing one or more mono-layers of graphene nanoribbons (GNRs) on the metal interconnect layer at a temperature greater than or equal to 800° C.

14. The method of claim 13, wherein forming the metal interconnect layer comprises depositing a metal, and the method further comprising:
forming a dielectric layer on the substrate; and
forming a barrier layer on the dielectric layer, wherein the barrier layer is disposed between the metal interconnect layer and the dielectric layer, the metal interconnect layer being in direct contact with the barrier layer.

15. The method of claim 14, wherein:
forming the metal interconnect layer comprises depositing one or more of copper (Cu), nickel (Ni), cobalt (Co), ruthenium (Ru), iridium (Ir), platinum (Pt) or palladium (Pd), the deposited metal having a (111) texture according to a convention (xyz), where x, y, and z represent respective crystallographic planes in three dimensions that are perpendicular to one another; and
forming the barrier layer comprises depositing tantalum (Ta), tantalum nitride (TaN), titanium (Ti), titanium nitride (TiN), titanium tungsten (TiW), tungsten nitride (WN) or ruthenium (Ru) using a physical vapor deposition (PVD) process.

16. The method of claim 14, wherein the dielectric layer is a first dielectric layer, and the method further comprising:
patterning the metal interconnect layer to form a line structure;
forming a second dielectric layer on the graphene layer using a deposition process without oxygen plasma, radicals or ions, the second dielectric layer being in direct contact with the graphene layer; and
forming a third dielectric layer on the second dielectric layer, the third dielectric layer being in direct contact with the second dielectric layer.

17. The method of claim 16, wherein patterning the metal interconnect layer comprises:
depositing a first hardmask material on the graphene layer;
depositing a second hardmask material on the first hardmask material;
depositing a photodefinable material on the second hardmask material;
selectively removing portions of the photodefinable material;
etching the second hardmask material to remove portions of the second hardmask material that are not protected by the photodefinable material, the etching of the second hardmask material being selective to the first hardmask material;
removing the photodefinable material; and
subsequent to removing the photodefinable material, etching the first hardmask material, the graphene layer and the metal interconnect layer to remove portions of the first hardmask material, the graphene layer and the metal interconnect layer that are not protected by the second hardmask material.

18. The method of claim 16, wherein:
forming the second dielectric, layer comprises depositing silicon oxide using a sputtering or spin-on process or depositing silicon carbide, silicon carbonitride, or silicon nitride using an oxygen-free chemical vapor deposition (CVD) process; and
forming the third dielectric layer comprises depositing silicon oxide using a CVD process, wherein the second dielectric layer is configured to protect the graphene layer from oxygen plasma, radicals or ions during formation of the third dielectric layer.

19. The method of claim 16, wherein forming the graphene layer comprises depositing graphene on sidewall surfaces of the metal interconnect layer.

20. The method of claim 16, further comprising:
forming a via structure by removing material of the third dielectric layer and the second dielectric layer to form an opening that exposes the graphene layer; and
depositing electrically conductive material of the via structure on the exposed graphene layer, wherein electrically conductive material of the via structure terminates in the graphene layer.

21. The method of claim 16, further comprising:
forming a via structure by removing material of the third dielectric layer, the second dielectric layer and the graphene layer to form an opening that exposes the metal interconnect layer; and
depositing electrically conductive material of the via structure into the opening on the exposed metal interconnect layer, wherein electrically conductive material of the via structure terminates in the metal interconnect layer.

22. The method of claim 21, wherein:
depositing the electrically conductive material of the via structure comprises depositing carbon nanotubes (CNTs); and
forming the via structure further comprises depositing a dielectric material to encapsulate the CNTs, and the method further comprising:
performing a planarization process to provide a planar surface of the CNTs with the third dielectric layer, wherein depositing the dielectric material to encapsulate the CNTs facilitates the planarization process of the CNTs.

23. The method of claim 13, further comprising:
selectively removing metal of the metal interconnect layer subsequent to forming the graphene layer to form at least two metal interconnect structures in the metal interconnect layer that are electrically coupled by a suspended portion of the graphene layer.

24. The method of claim 23, wherein at least one of the two metal interconnect structures is a bond pad, and the method flintier comprising:
depositing a dielectric material to fill a region between the suspended portion of the graphene layer and the substrate where the metal of the metal interconnect layer has been removed; and
forming a bump or pillar on and electrically coupled with the bond pad.

* * * * *

UNITED STATES PATENT AND TRADEMARK OFFICE
CERTIFICATE OF CORRECTION

PATENT NO. : 9,680,105 B2  
APPLICATION NO. : 14/931764  
DATED : November 3, 2015  
INVENTOR(S) : Hans-Joachim Barth Page 1 of 1

It is certified that error appears in the above-identified patent and that said Letters Patent is hereby corrected as shown below:

In the Claims

Column 26  
Line 38, Claim 5, "...being in,..." should read – "...being in..."

Column 27  
Line 36, Claim 11, "...dielectric,..." should read – "...dielectric..."

Column 28  
Line 55, Claim 18, "...dielectric,..." should read – "...dielectric..."

Column 30  
Line 16, Claim 24, "...flintier..." should read – "...further..."

Signed and Sealed this  
Seventh Day of May, 2019

Andrei Iancu  
*Director of the United States Patent and Trademark Office*